United States Patent
Takaya et al.

(10) Patent No.: US 10,283,180 B2
(45) Date of Patent: May 7, 2019

(54) NONVOLATILE RESISTANCE CHANGING SEMICONDUCTOR MEMORY USING FIRST AND SECOND WRITING OPERATIONS

(71) Applicant: KABUSHIKI KAISHA TOSHIBA, Minato-ku (JP)

(72) Inventors: Satoshi Takaya, Kawasaki (JP); Hiroki Noguchi, Yokohama (JP); Keiko Abe, Yokohama (JP); Shinobu Fujita, Inagi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/232,956

(22) Filed: Aug. 10, 2016

(65) Prior Publication Data
US 2017/0047106 A1 Feb. 16, 2017

(30) Foreign Application Priority Data

Aug. 10, 2015 (JP) .................................. 2015-158095

(51) Int. Cl.
*G11C 11/16* (2006.01)
*G11C 13/00* (2006.01)

(52) U.S. Cl.
CPC ...... *G11C 11/1675* (2013.01); *G11C 11/1659* (2013.01); *G11C 11/1693* (2013.01); *G11C 13/0069* (2013.01); *G11C 2013/0071* (2013.01)

(58) Field of Classification Search
CPC ............ G11C 11/1675; G11C 11/1693; G11C 11/1659; G11C 13/0069; G11C 2013/0071
See application file for complete search history.

(56) References Cited

U.S. PATENT DOCUMENTS

| | | | |
|---|---|---|---|
| 8,437,180 B2 | 5/2013 | Higo et al. | |
| 8,582,353 B2 | 11/2013 | Lee | |
| 9,472,256 B1 * | 10/2016 | Andre | G11C 11/1675 |
| 2002/0080664 A1 | 6/2002 | Takashima | |
| 2008/0007993 A1* | 1/2008 | Saitoh | G11C 11/16 365/158 |
| 2008/0247222 A1 | 10/2008 | Jung et al. | |
| 2008/0266943 A1 | 10/2008 | Yang et al. | |
| 2009/0034320 A1* | 2/2009 | Ueda | G11C 11/16 365/148 |
| 2010/0177558 A1 | 7/2010 | Sakimura et al. | |
| 2010/0328998 A1 | 12/2010 | Higo et al. | |

(Continued)

FOREIGN PATENT DOCUMENTS

| JP | 2002-197855 A1 | 7/2002 |
|---|---|---|
| JP | 3856424 B2 | 12/2006 |

(Continued)

OTHER PUBLICATIONS

T. Ohsawa, et al., "1 Mb 4T-2MTJ Nonvolatile STT-RAM for Embedded Memories Using 32b Fine-Grained Power Gating Technique with 1.0ns/200ps Wake-up/Power-off Times" 2012 Symposium on VLSI Circuits Digest of Technical Papers, Jun. 13-15, 2012, pp. 46-47.

(Continued)

*Primary Examiner* — Jerome Leboeuf
(74) *Attorney, Agent, or Firm* — Oblon, McClelland, Maier & Neustadt, L.L.P.

(57) ABSTRACT

A nonvolatile semiconductor memory includes a resistance-change element having first and second terminals, a transistor having third and fourth terminals and a control terminal, the third terminal being connected to the second terminal, and a first driver electrically connected to the control terminal, applying a first potential to the control terminal in a first write operation, and applying a second potential larger than the first potential to the control terminal in a second write operation.

6 Claims, 32 Drawing Sheets

(56) References Cited

U.S. PATENT DOCUMENTS

| | | | |
|---|---|---|---|
| 2011/0157966 A1* | 6/2011 | Lee | G11C 11/16 |
| | | | 365/158 |
| 2011/0292715 A1 | 12/2011 | Ishihara et al. | |
| 2012/0188816 A1 | 7/2012 | Kim et al. | |
| 2013/0322161 A1 | 12/2013 | Noguchi et al. | |
| 2014/0293685 A1 | 10/2014 | Noguchi et al. | |
| 2016/0225428 A1* | 8/2016 | Ohsawa | G11C 11/1659 |

FOREIGN PATENT DOCUMENTS

| | | | |
|---|---|---|---|
| JP | 2008-269712 A | 11/2008 | |
| JP | 2010-524144 A | 7/2010 | |
| JP | 2011-8849 A | 1/2011 | |
| JP | 2011-198416 A | 10/2011 | |
| JP | 2011-248953 A | 12/2011 | |
| JP | 2012-509548 A | 4/2012 | |
| JP | 2012-89187 A | 5/2012 | |
| JP | 2013-114726 A | 6/2013 | |
| JP | 5231528 B2 | 7/2013 | |
| JP | 2013-251035 A | 12/2013 | |
| JP | 2014-191835 A | 10/2014 | |
| WO | WO 2008/018266 A1 | 2/2008 | |

OTHER PUBLICATIONS

Office Action (Notice of Rejection) issued in Japanese Patent Application 2015-158095 dated Jul. 5, 2016 (with English Translation).

\* cited by examiner

| | Potential $V_{WL}$ of word line |
|---|---|
| First write operation | $V_{WL1}$ |
| Second write operation | $V_{WL2}$ |

$V_{WL1} < V_{WL2}$

| | Change of state of resistance change element |
|---|---|
| First write operation | P → AP |
| Second write operation | AP → P |

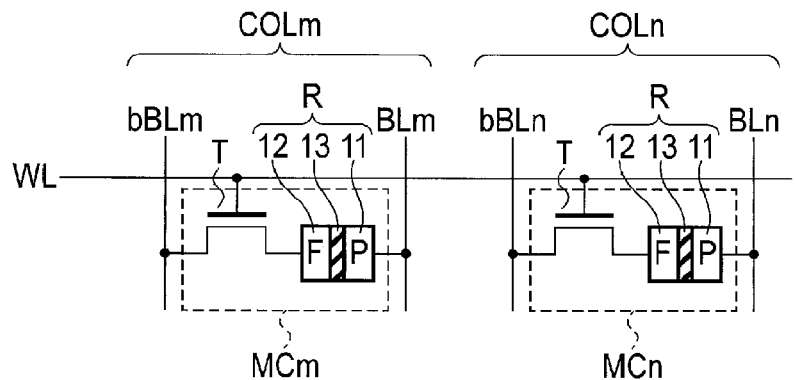
F I G. 12
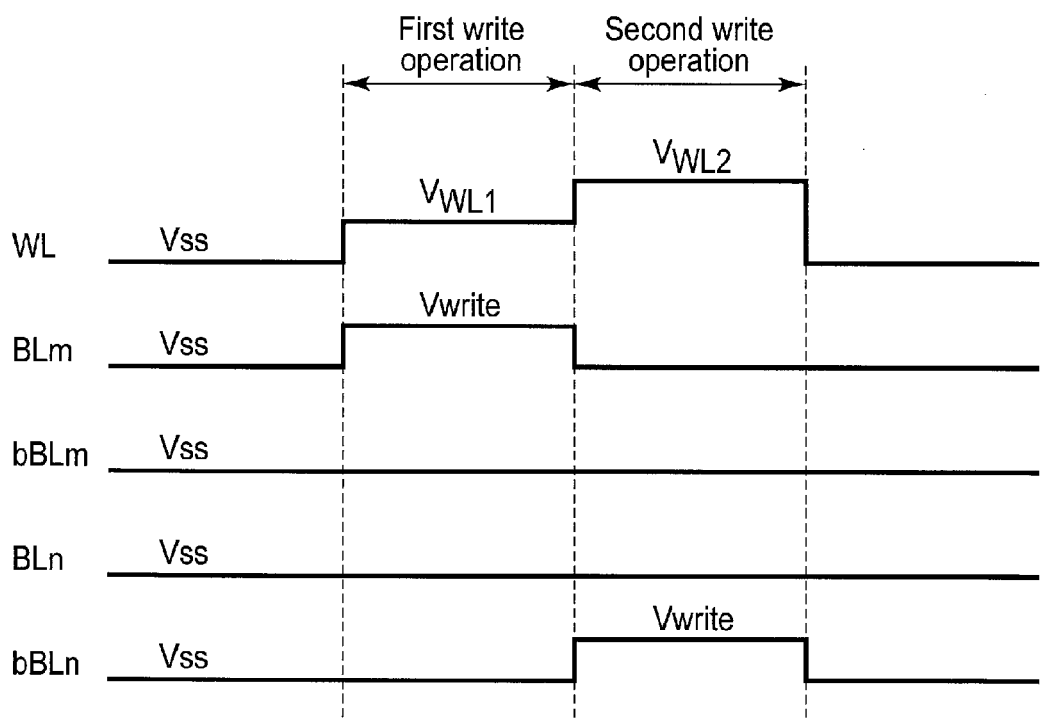
F I G. 13

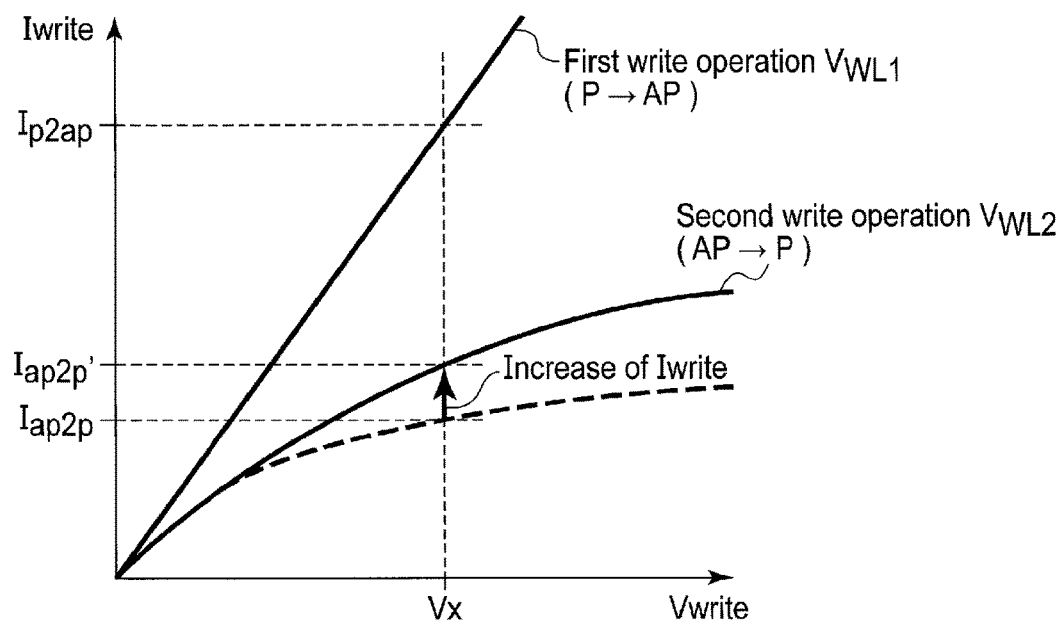
F I G. 16
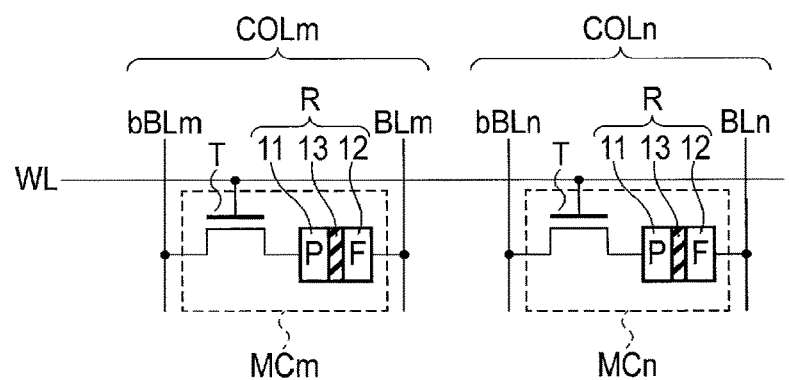
F I G. 17

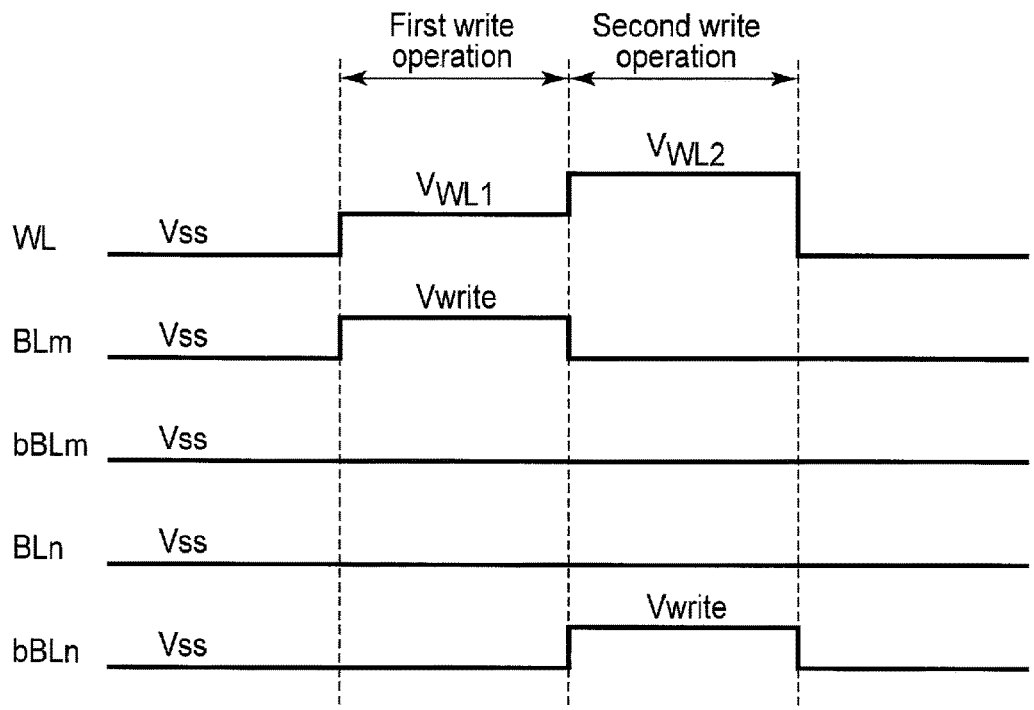
F I G. 18
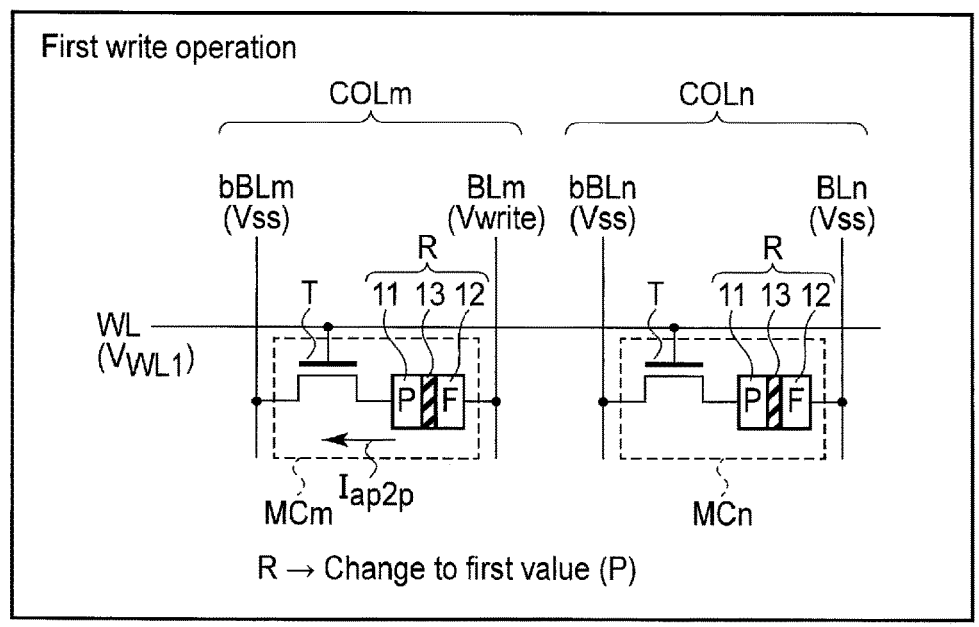
F I G. 19

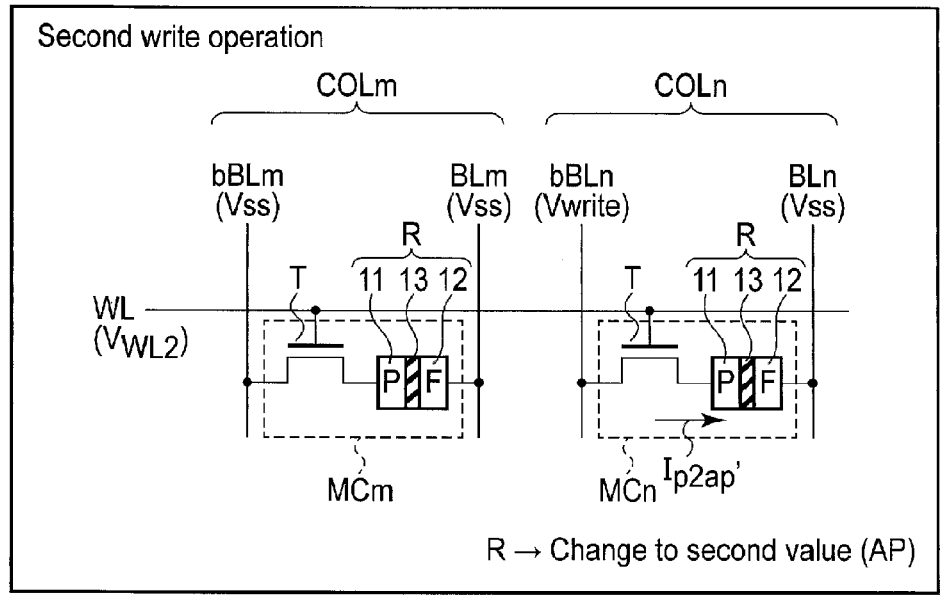
F I G. 20
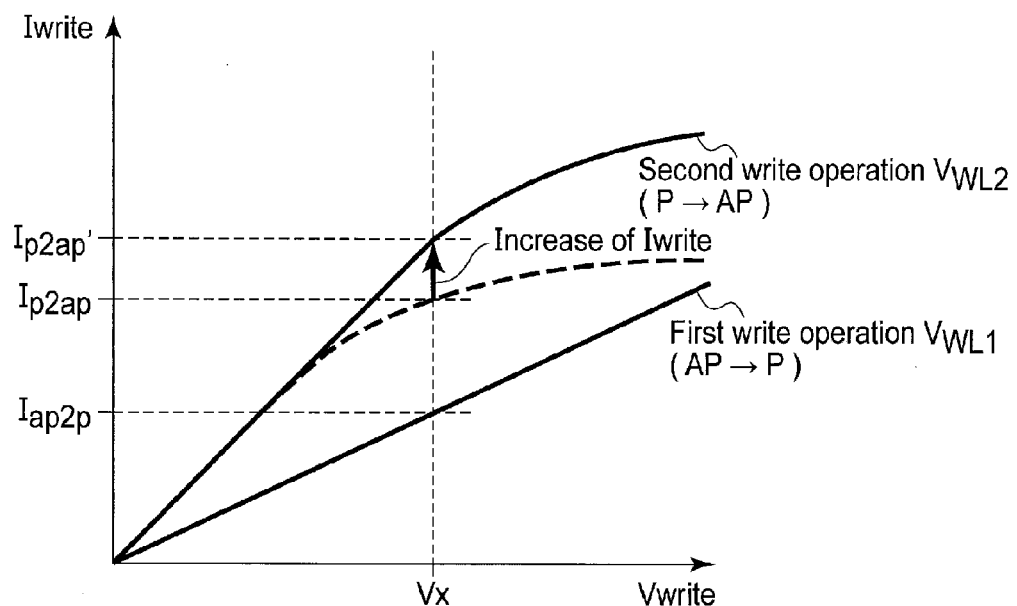
F I G. 21

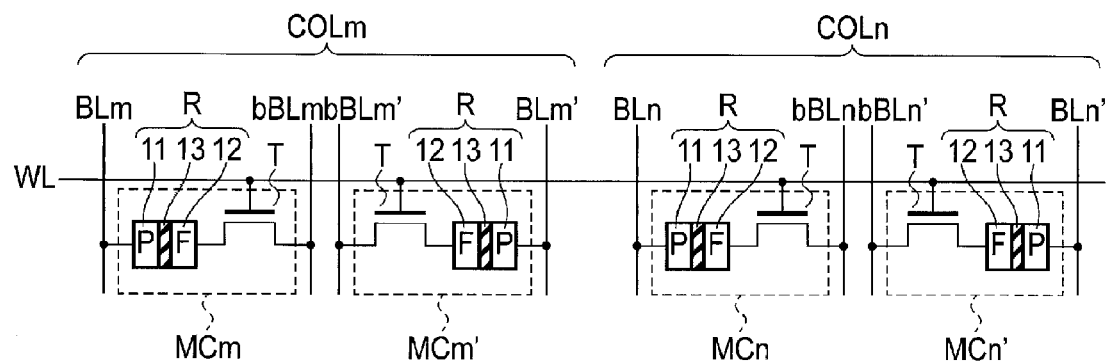
F I G. 22
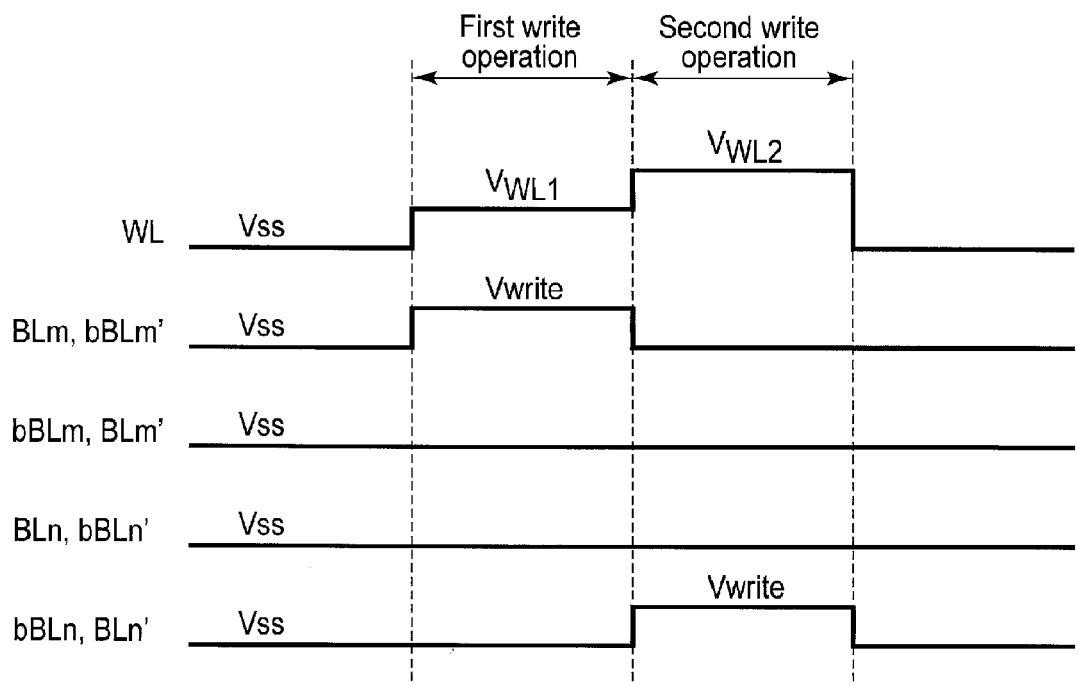
F I G. 23

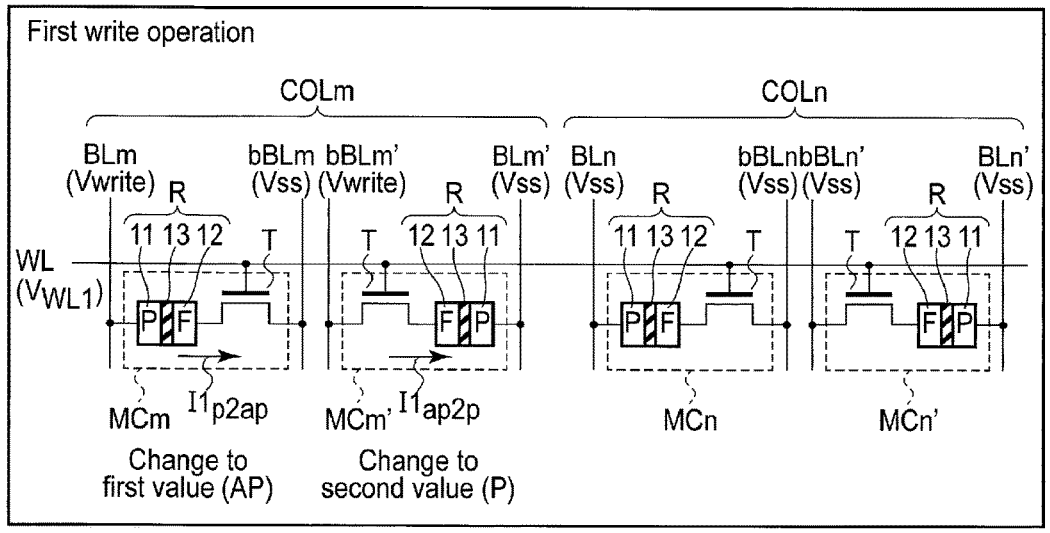
F I G. 24
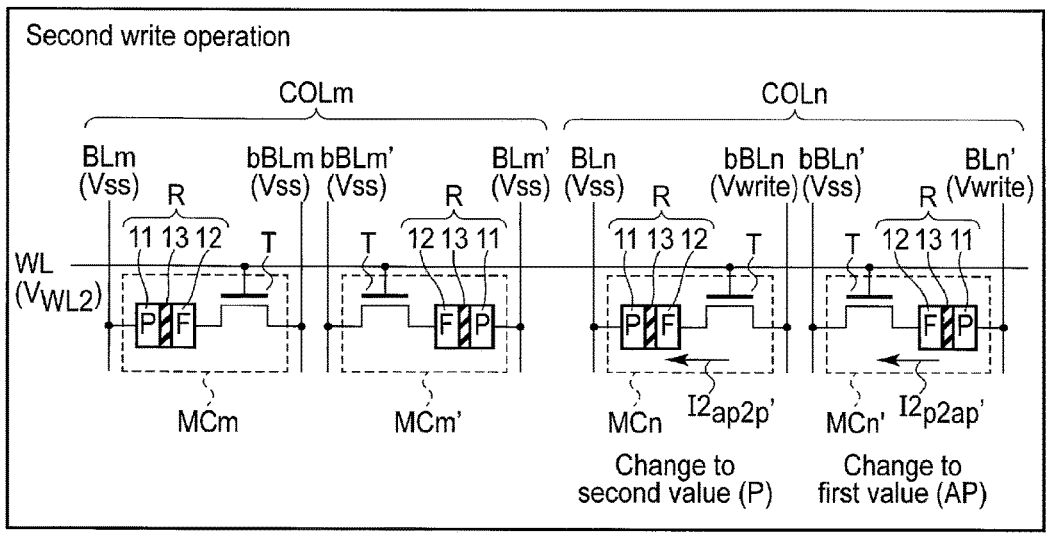
F I G. 25

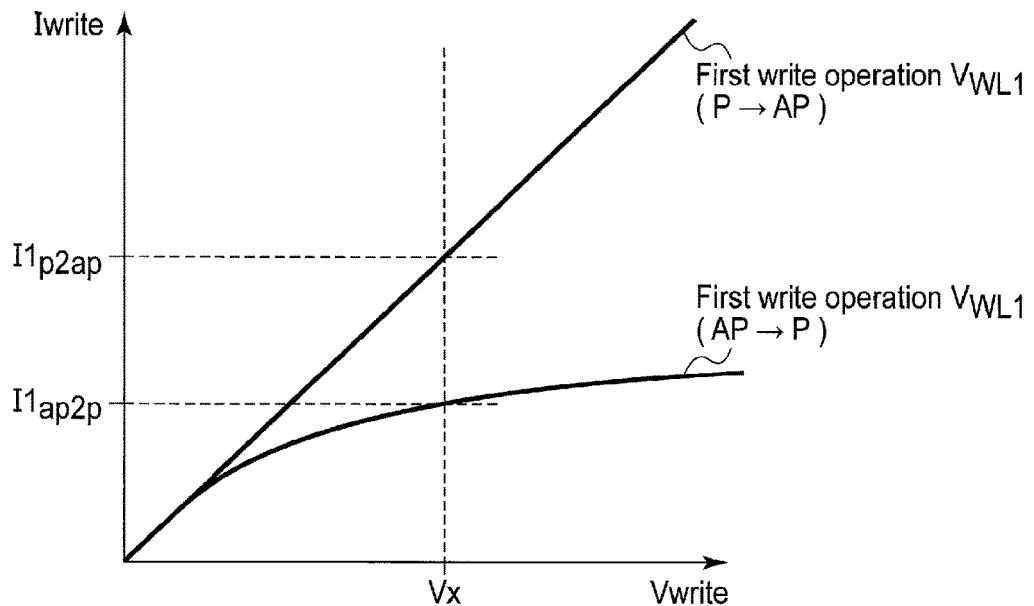
F I G. 26
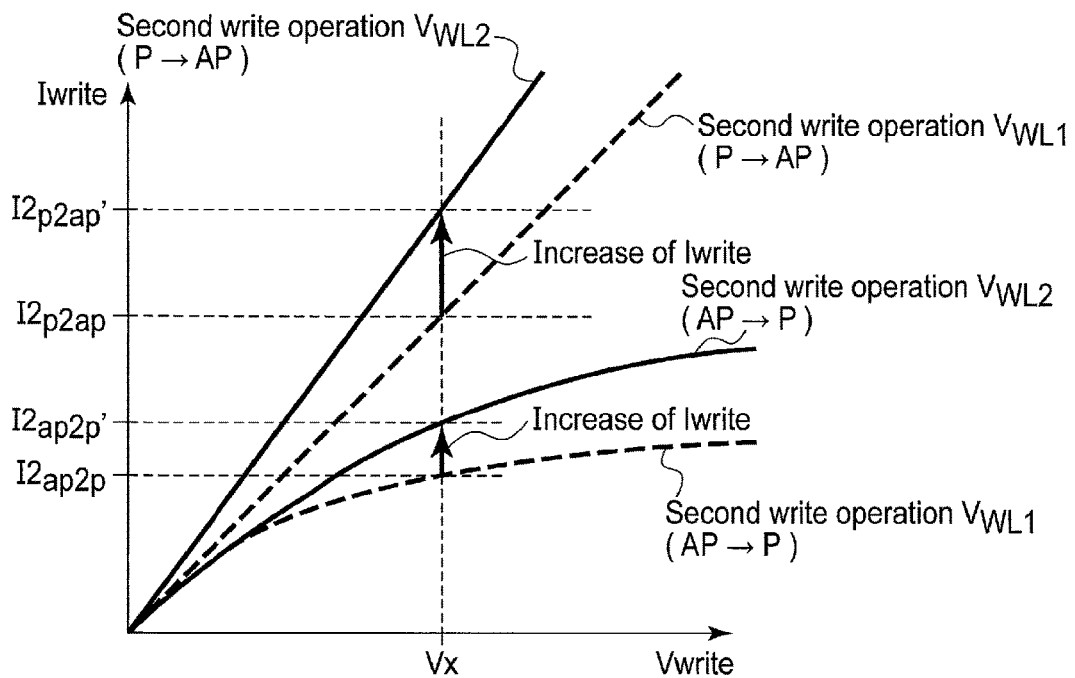
F I G. 27

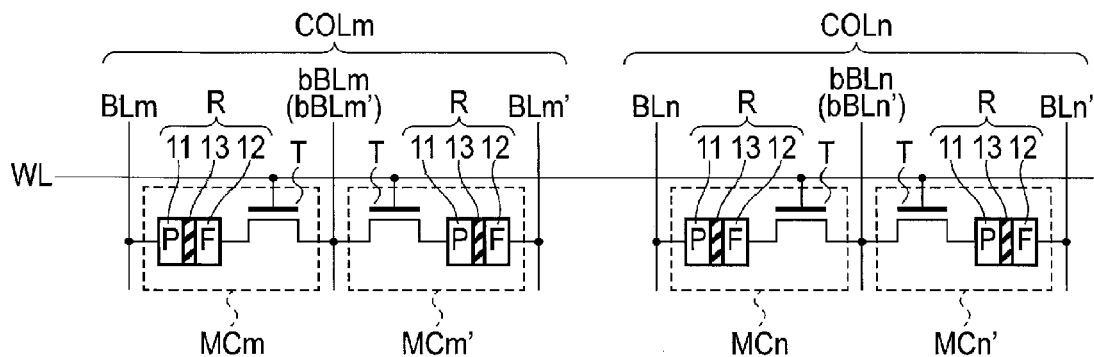
F I G. 28
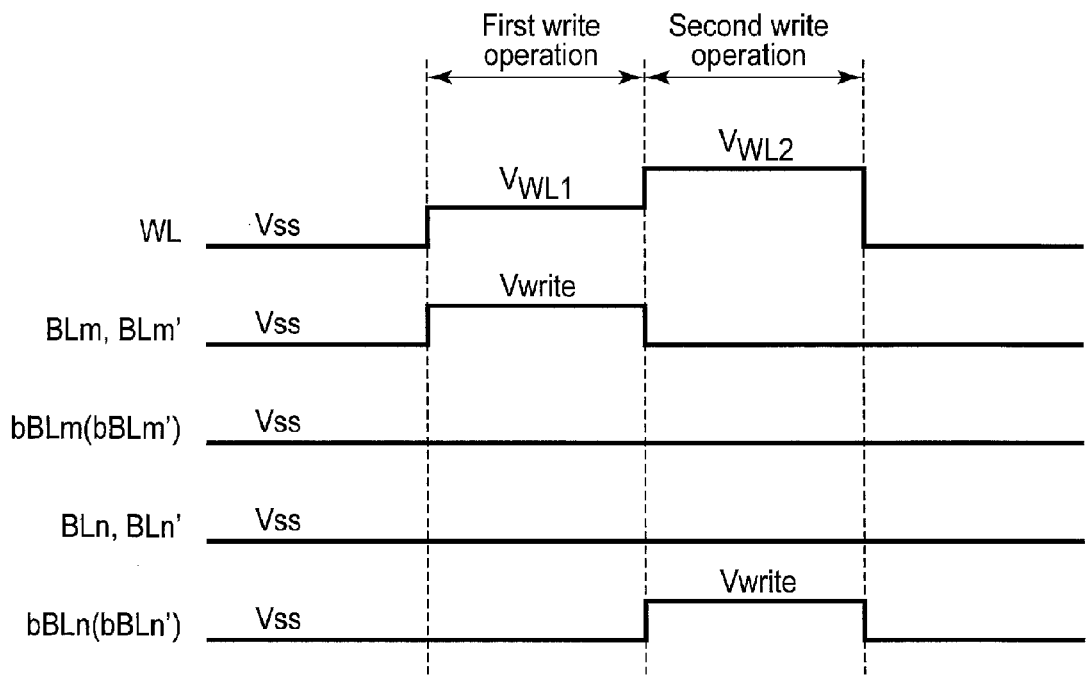
F I G. 29

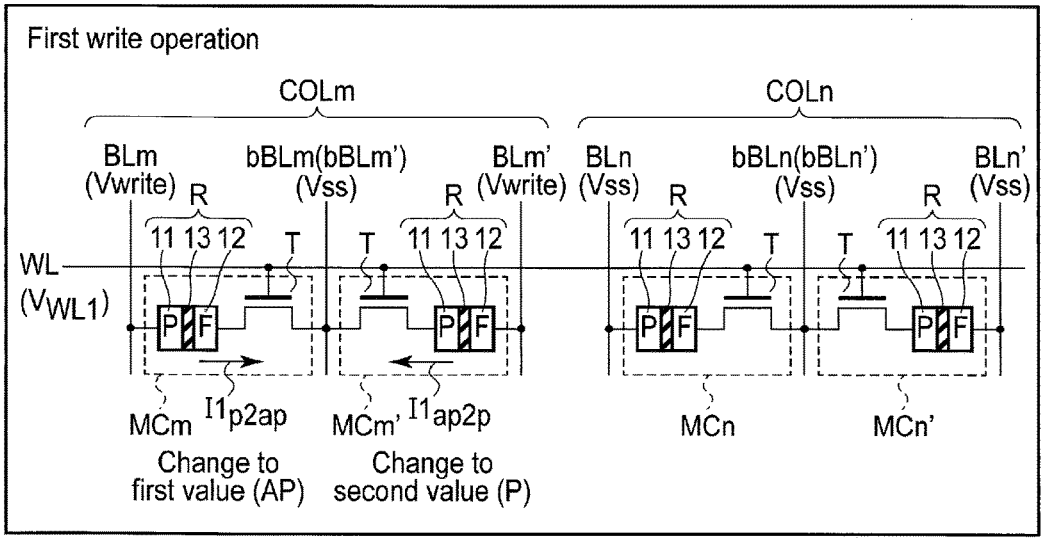
F I G. 30
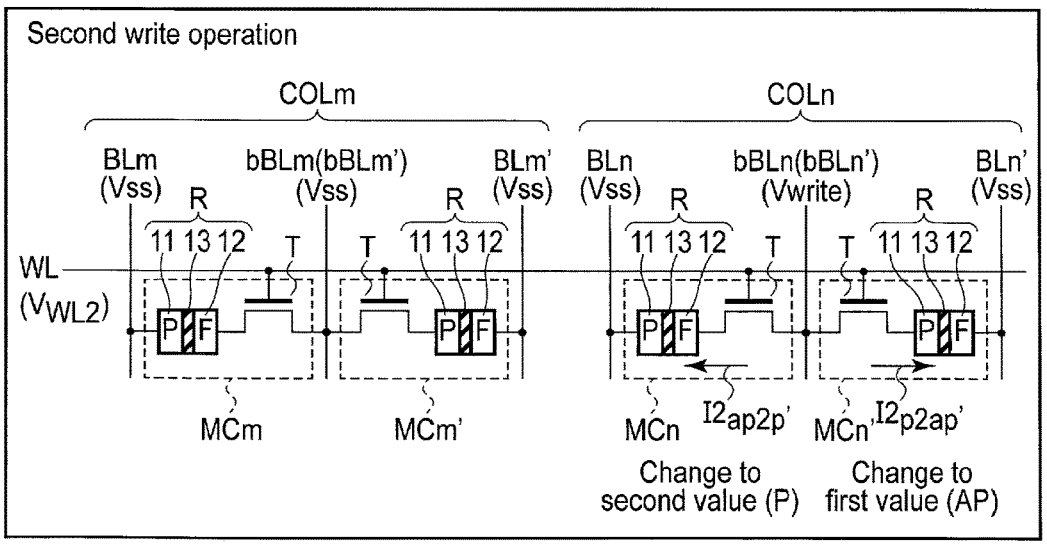
F I G. 31

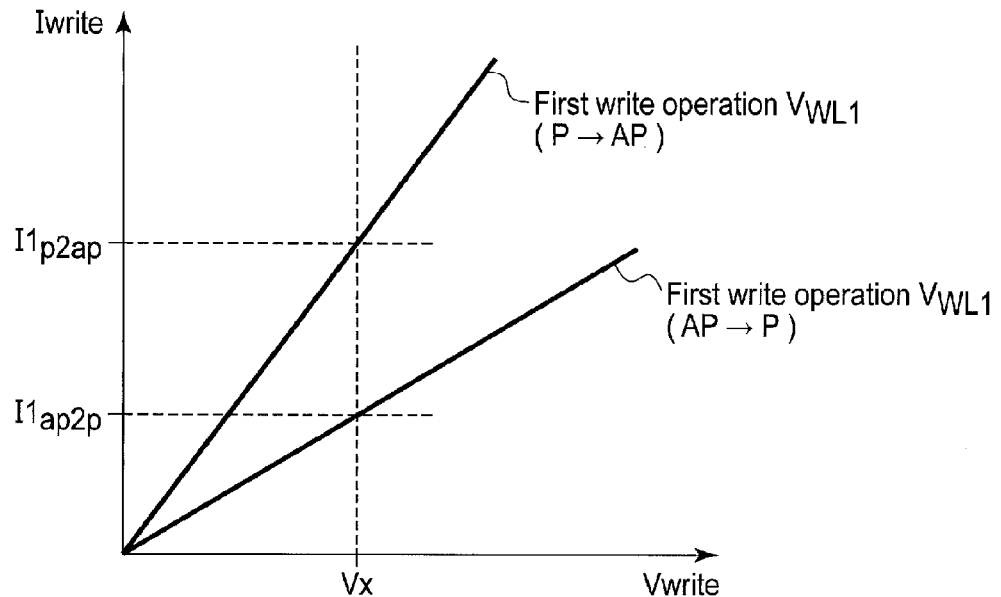
F I G. 32
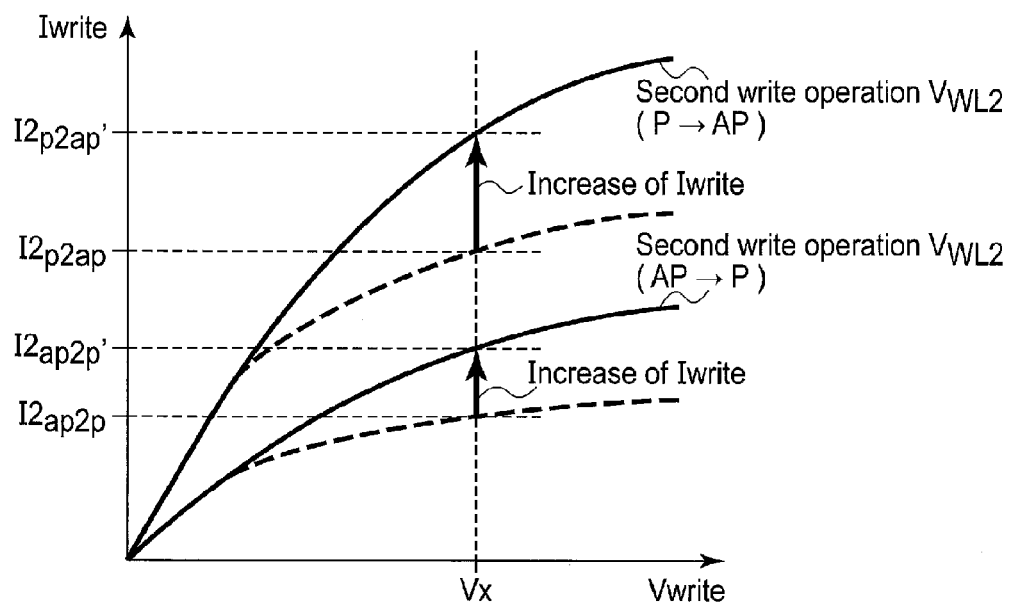
F I G. 33

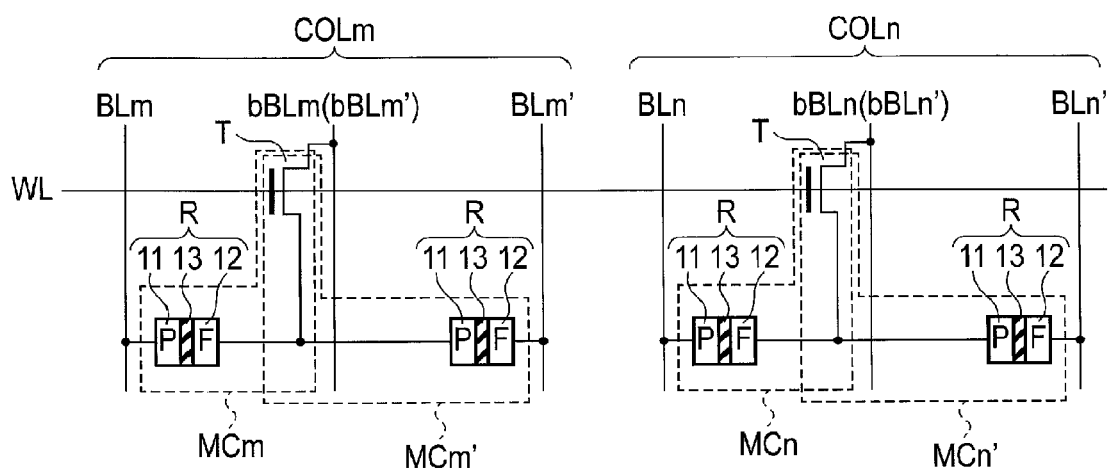
F I G. 34

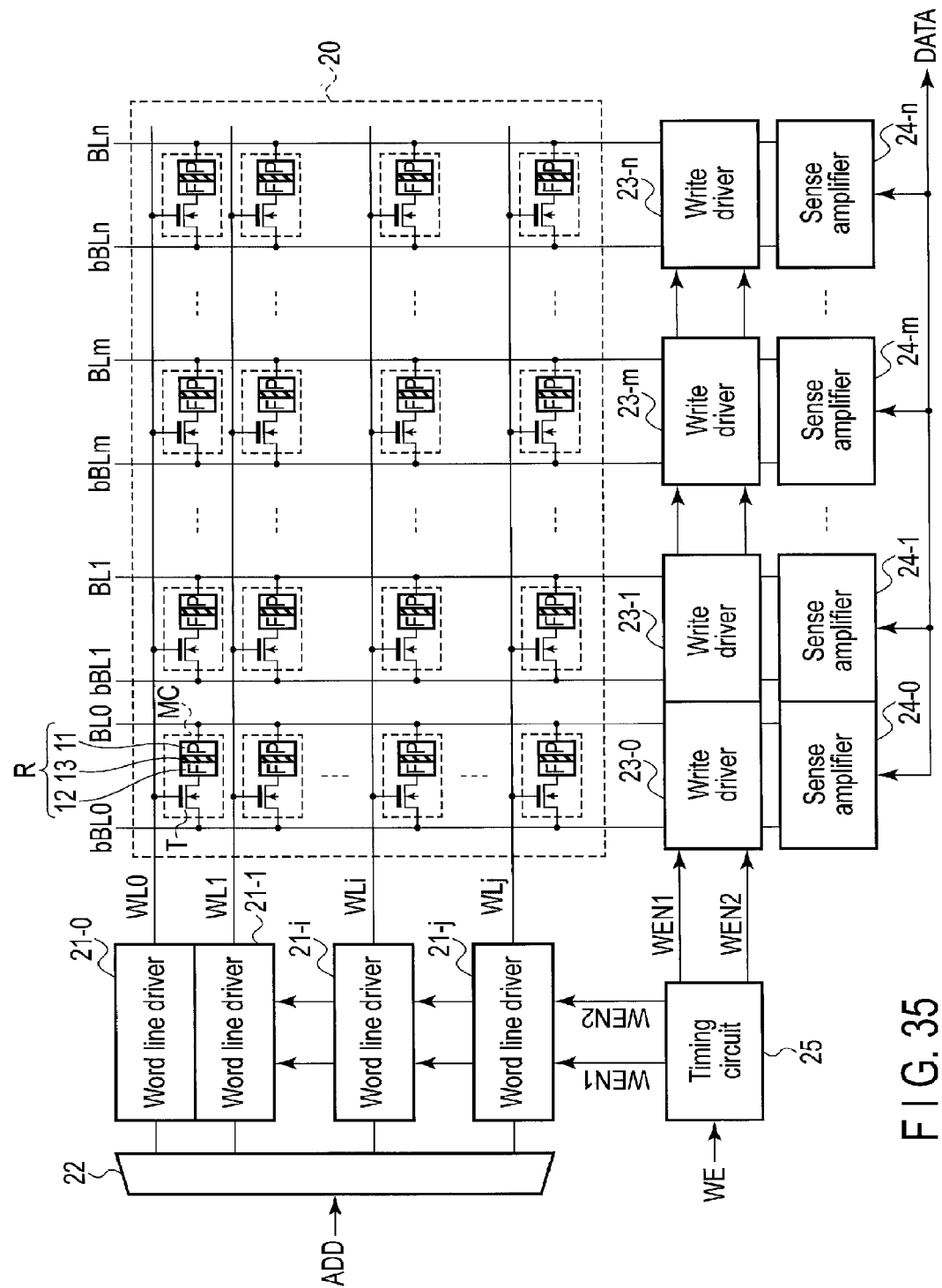
F I G. 35

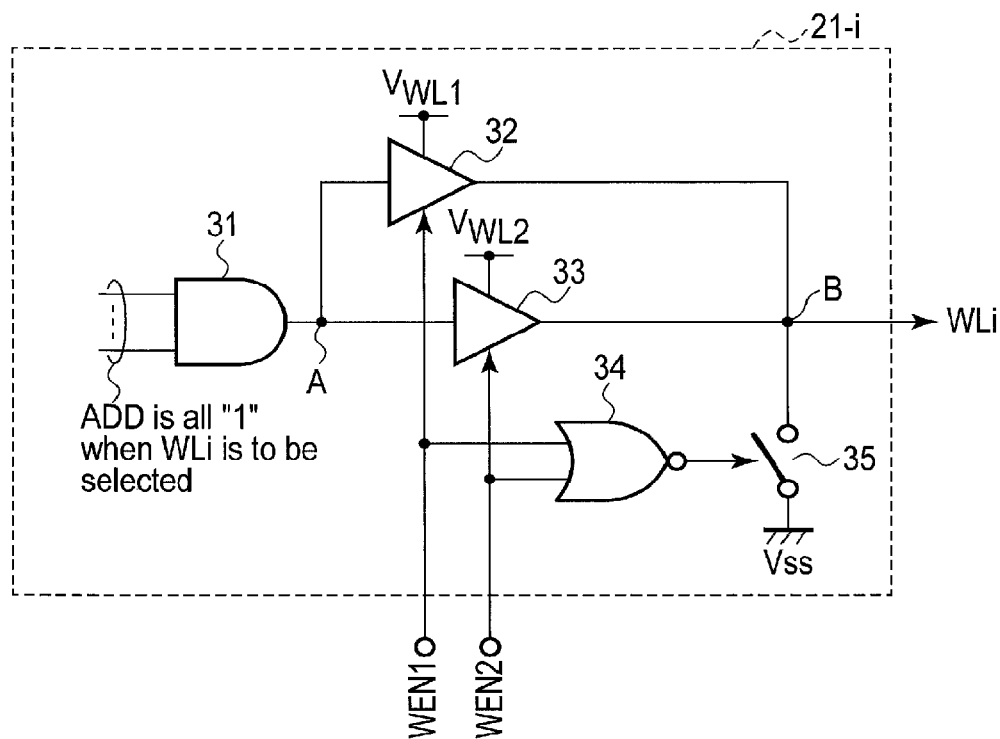
F I G. 36
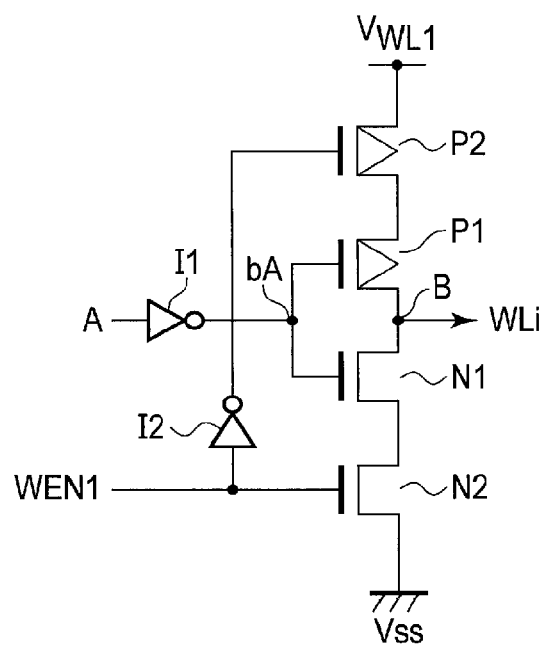
F I G. 37

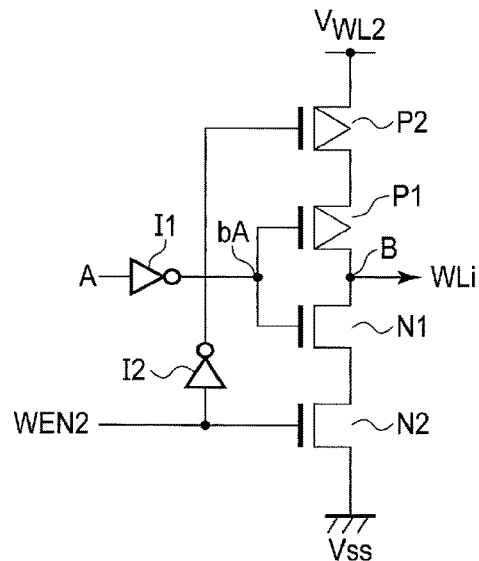
F I G. 38
|  | A | WEN1 | WEN2 | WLi |
|---|---|---|---|---|
| Case that WLi is to be selected | 1 | 0 | 0 | Vss |
|  | 1 | 1 | 0 | $V_{WL1}$ |
|  | 1 | 0 | 1 | $V_{WL2}$ |
| Case that WLi is not to be selected | 0 | 0 | 0 | Vss |
|  | 0 | 1 | 0 | Vss |
|  | 0 | 0 | 1 | Vss |
F I G. 39

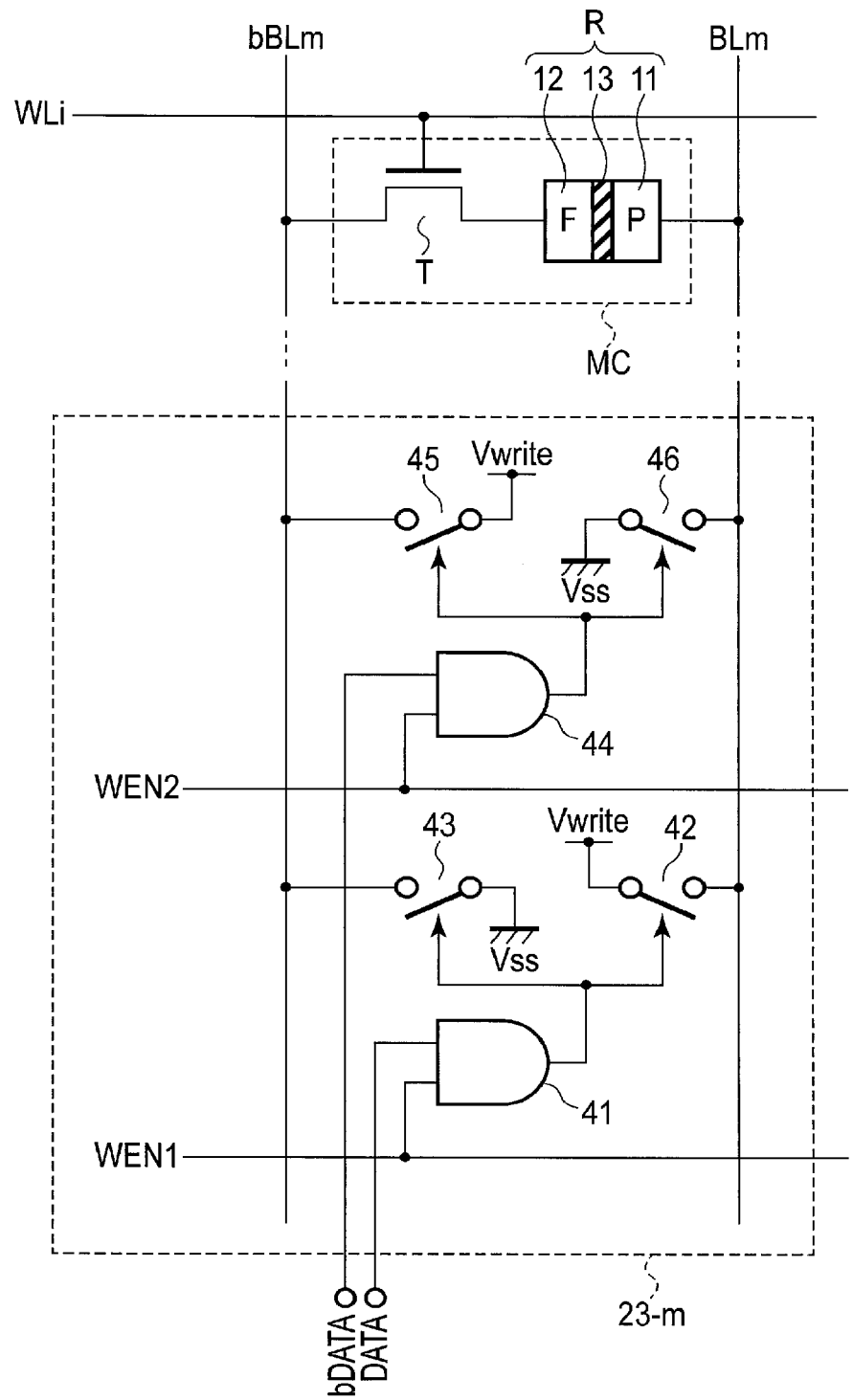
F I G. 40

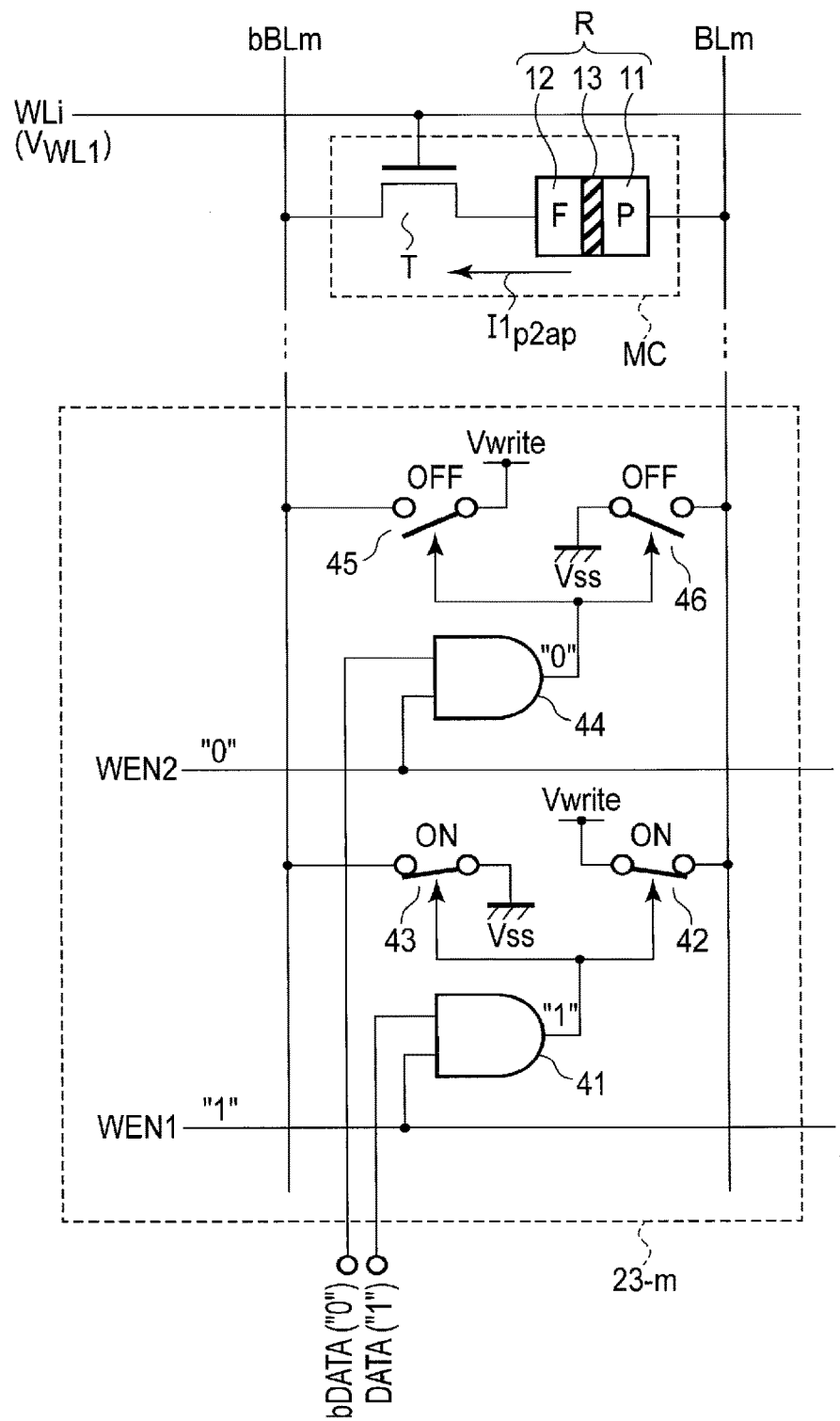
F I G. 41

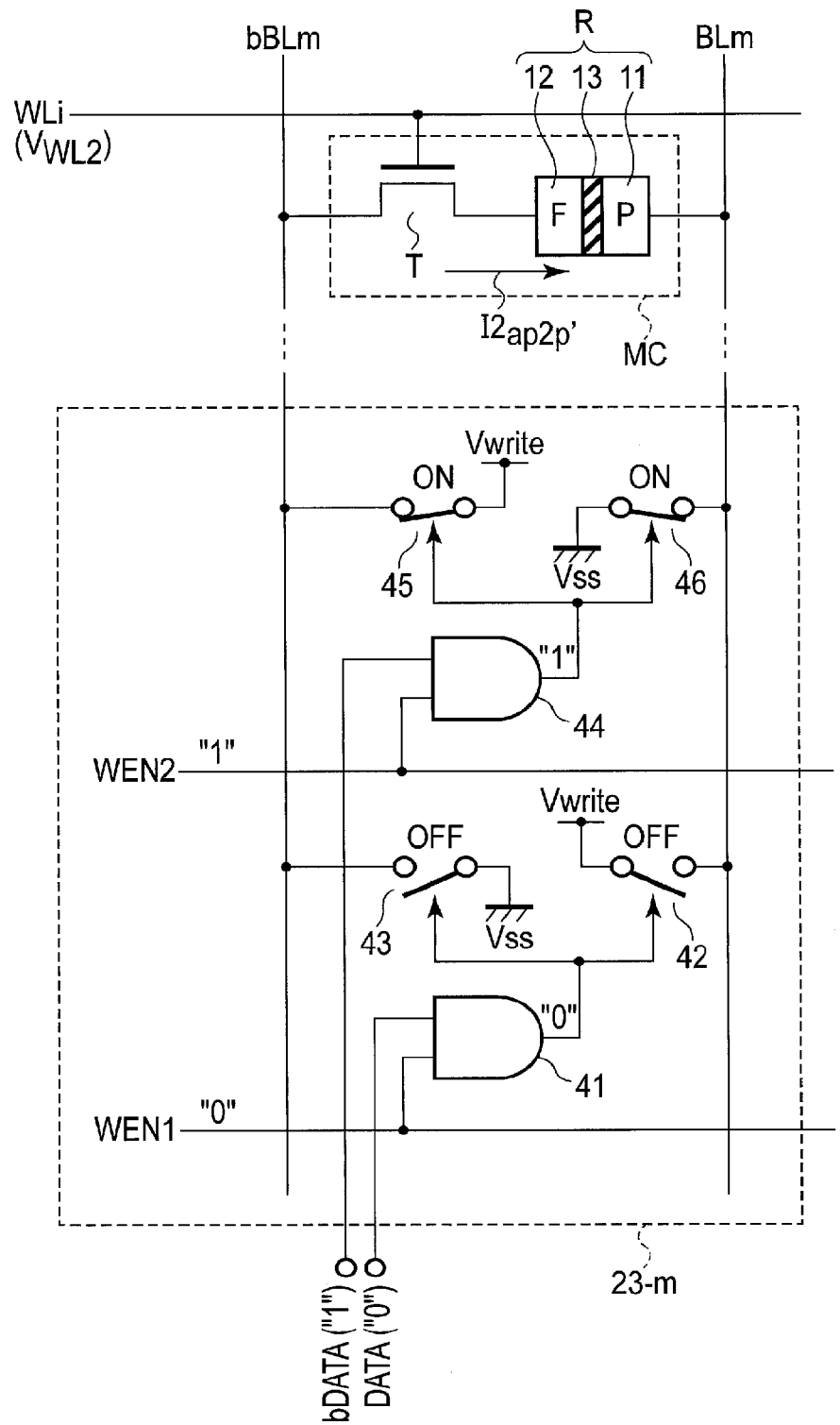
F I G. 42

| | WEN1 | WEN2 | DATA | bDATA | Write current Iwrite | State of resistance change element R |
|---|---|---|---|---|---|---|
| "1"-write operation Selected cell | 1 | 0 | 1 | 0 | BLm → bBLm | Change to antiparallel state |
| "1"-write operation Unselected cell | | | 0 | 1 | × | No change |
| "0"-write operation Selected cell | 0 | 1 | 0 | 1 | bBLm → BLm | Change to parallel state |
| "0"-write operation Unselected cell | | | 1 | 0 | × | No change |

F I G. 43

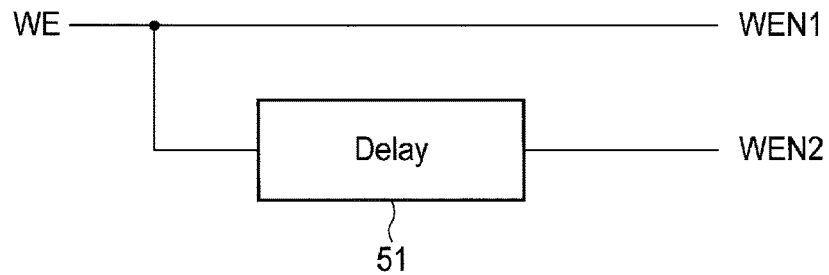
F I G. 44
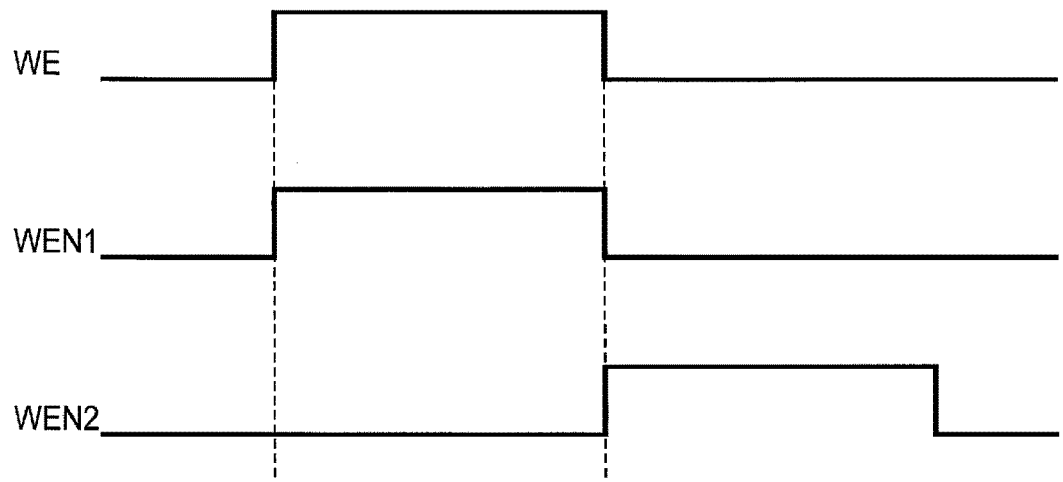
F I G. 45

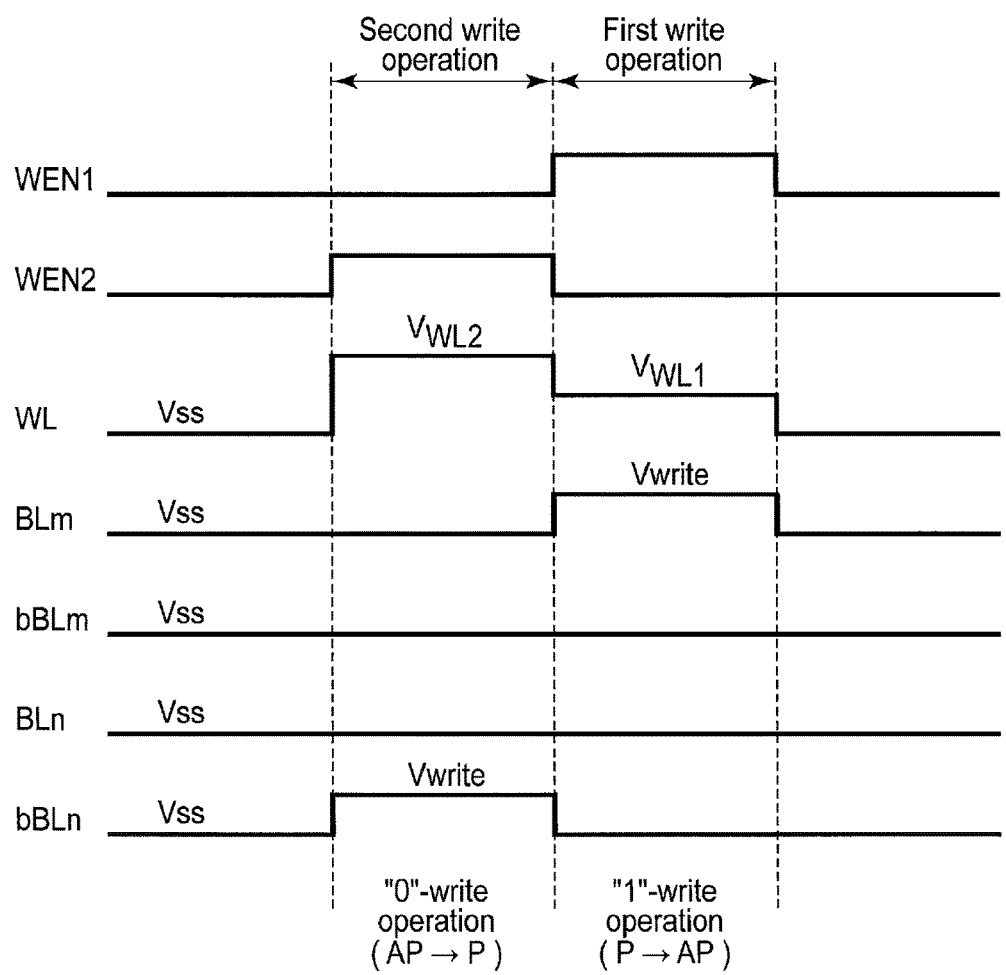
F I G. 47

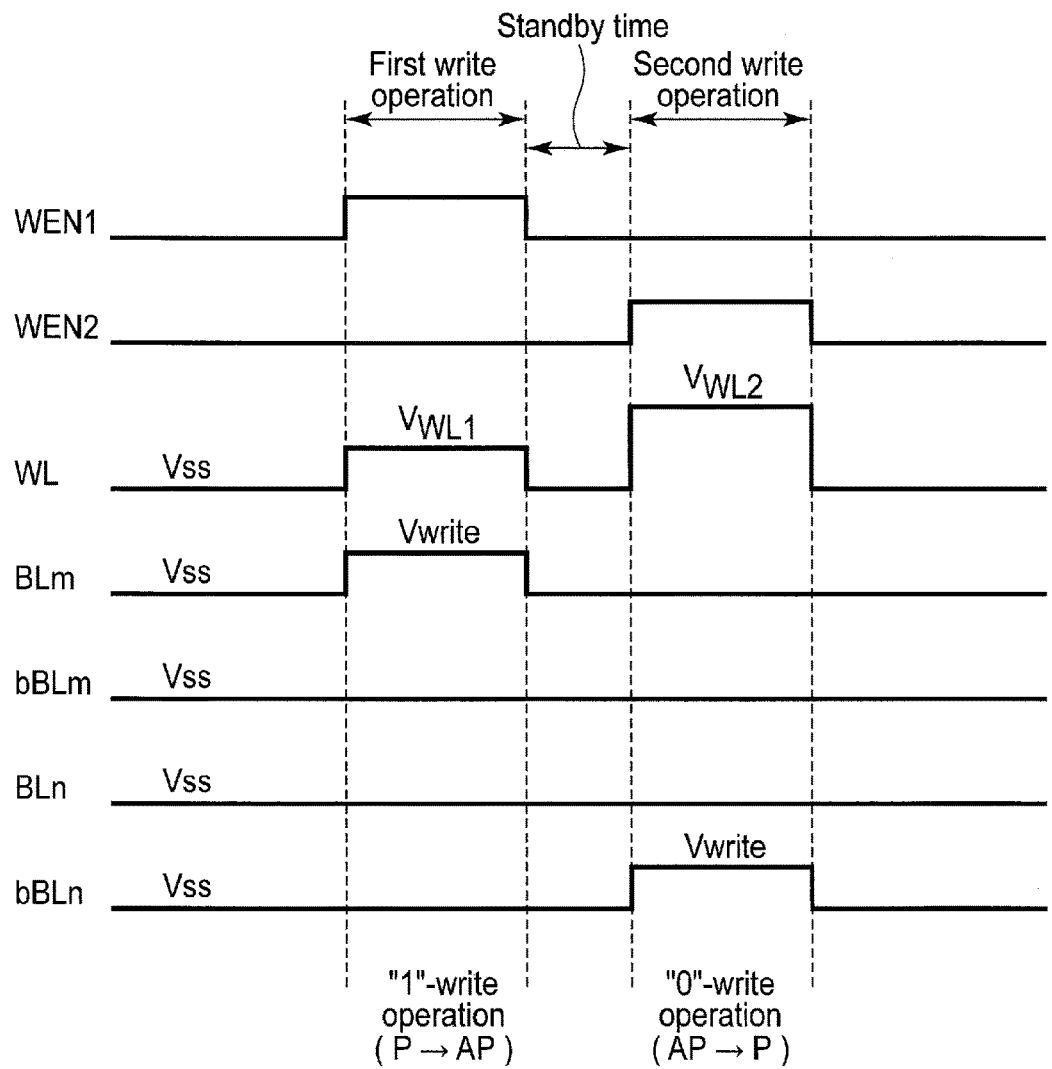
F I G. 48

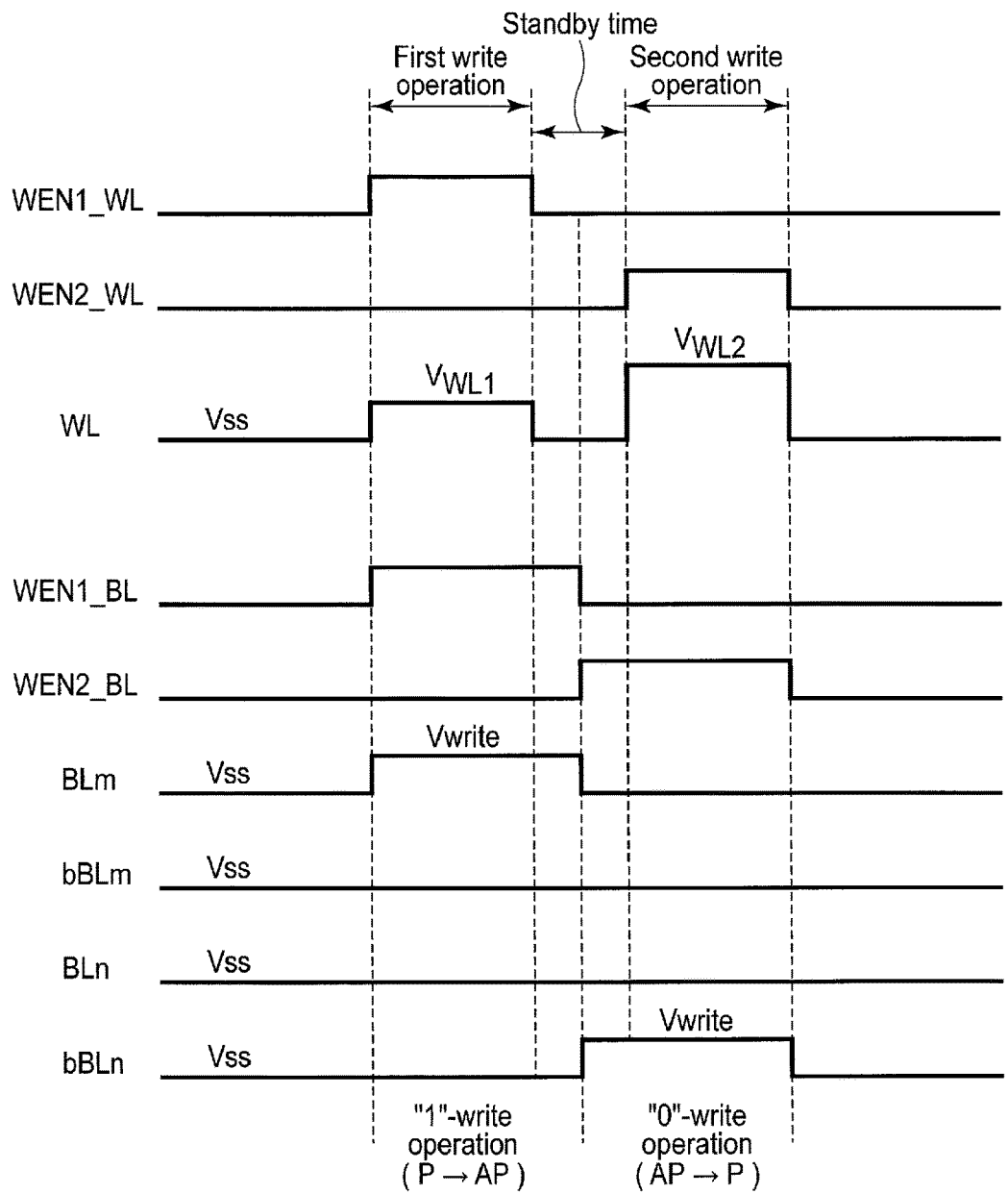
F I G. 49

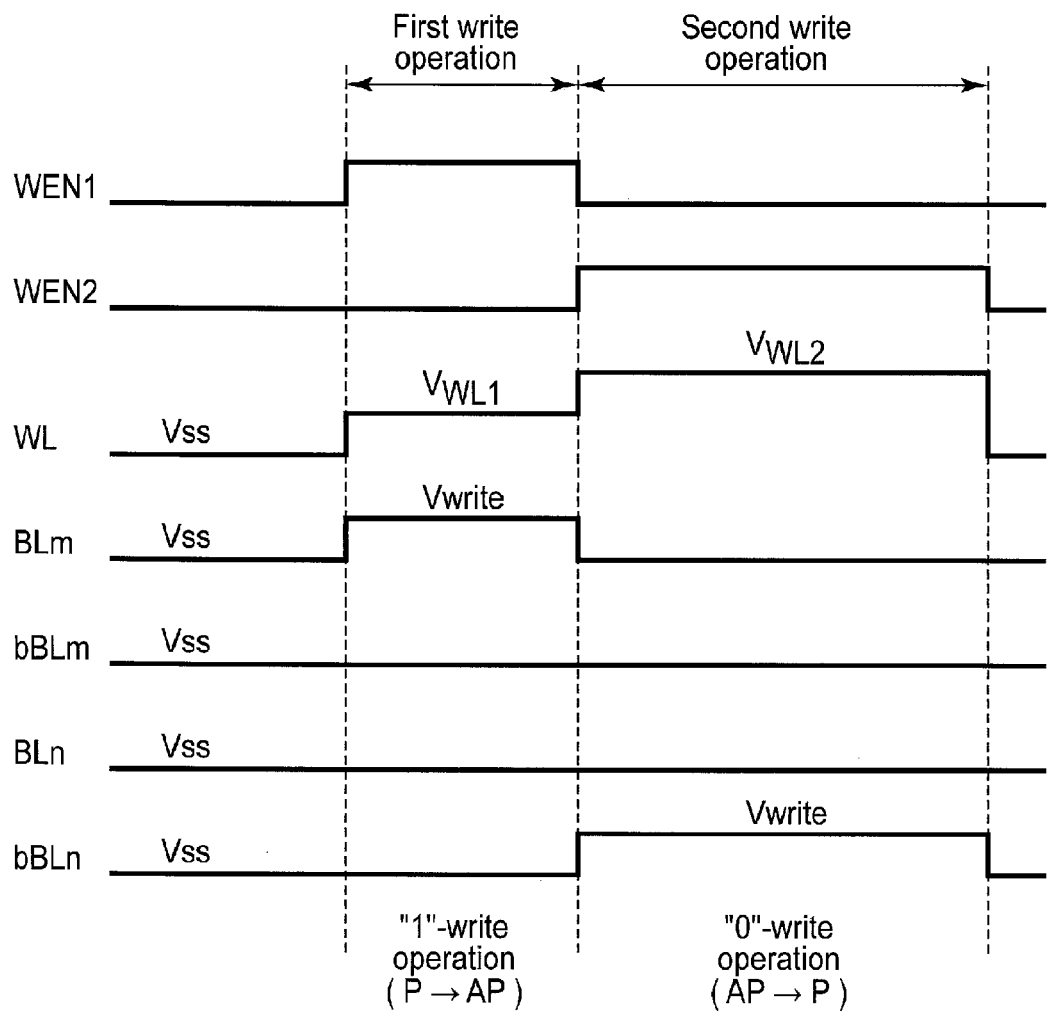
F I G. 50

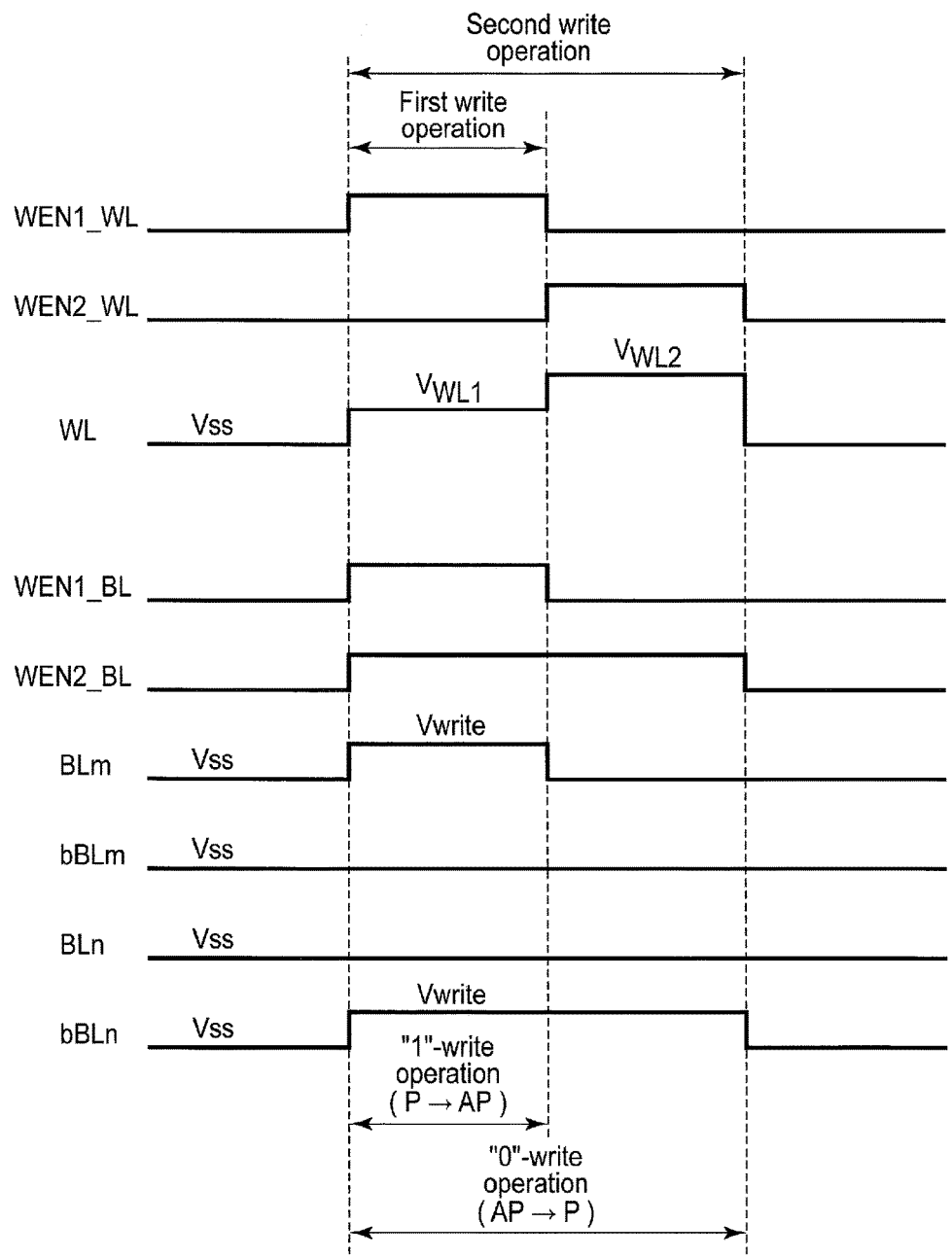
F I G. 51

NONVOLATILE RESISTANCE CHANGING SEMICONDUCTOR MEMORY USING FIRST AND SECOND WRITING OPERATIONS

CROSS-REFERENCE TO RELATED APPLICATIONS

This application is based upon and claims the benefit of priority from Japanese Patent Application No. 2015-158095, filed Aug. 10, 2015, the entire contents of which are incorporated herein by reference.

FIELD

Embodiments described herein relate generally to a nonvolatile semiconductor memory.

BACKGROUND

A nonvolatile semiconductor memory such as a spin-torque-transfer magnetic random access memory (STT-MRAM) comprises, for example, a memory cell including a resistance-change element and a select transistor (field-effect transistor [FET]) which are connected in series. The resistance of the resistance-change element is changed to a first value by a first current flowing from the resistance-change element to the select transistor, and changed to a second value by a second current flowing from the select transistor to the resistance-change element.

At this time, however, a saturation phenomenon occurs. That is, the first current is increased in proportion to an increase in voltage between the source and the drain of the select transistor in a first write operation for changing the resistance-change element to the first value, whereas the second current is not sufficiently increased even by increasing the voltage between the source and the drain of the select transistor in a second write operation for changing the resistance-change element to the second value. This is because the source potential (potential on the low potential side) of the select transistor is increased by the resistance of the resistance-change element in the second write operation.

If the gate potential (potential of word line) is raised to increase the second current in the second write operation, the first current is unnecessarily increased in the first write operation, which accelerates the deterioration of the resistance-change element. If the gate potential is optimized to obtain a suitable first current for the first write operation, however, the second current becomes so small in the second write operation that a write error rate is raised.

BRIEF DESCRIPTION OF THE DRAWINGS

FIG. 12 is a diagram showing memory cells of the nonvolatile semiconductor memory.
FIG. 13 is a chart showing write operations to the memory cells of FIG. 12.
FIG. 16 is a graph showing a relationship between Vwrite and Iwrite using a potential of a word line as a parameter.
FIG. 17 is a diagram showing memory cells of a third embodiment.
FIG. 18 is a chart showing write operations to the memory cells of FIG. 17.
FIG. 19 is a diagram showing a relationship between potentials in a first write operation.
FIG. 20 is a diagram showing a relationship between potentials in a second write operation.
FIG. 21 is a graph showing a relationship between Vwrite and Iwrite using a potential of a word line as a parameter.
FIG. 22 is a diagram showing memory cells of a fourth embodiment.
FIG. 23 is a chart showing write operations to the memory cells of FIG. 22.
FIG. 24 is a diagram showing a relationship between potentials in a first write operation.
FIG. 25 is a diagram showing a relationship between potentials in a second write operation.
FIG. 26 and FIG. 27 are graphs each showing a relationship between Vwrite and Iwrite using a potential of a word line as a parameter.
FIG. 28 is a diagram showing memory cells of a fifth embodiment.
FIG. 29 is a chart showing write operations to the memory cells of FIG. 28.
FIG. 30 is a diagram showing a relationship between potentials in a first write operation.
FIG. 31 is a diagram showing a relationship between potentials in a second write operation.
FIG. 32 and FIG. 33 are graphs each showing a relationship between Vwrite and Iwrite using a potential of a word line as a parameter.
FIG. 34 is a diagram showing memory cells of a sixth embodiment.
FIG. 35 is a diagram showing a nonvolatile semiconductor memory of a seventh embodiment.
FIG. 36 is a diagram showing an example of a word line driver.
FIG. 37 and FIG. 38 are diagrams each showing an example of a buffer circuit.
FIG. 39 is a table showing a summary of operations of the word line driver of FIG. 36.
FIG. 40 is a diagram showing an example of a write driver.
FIG. 41 is a diagram showing the write driver in a 1-write operation.
FIG. 42 is a diagram showing the write driver in a 0-write operation.

FIG. 43 is a table showing a summary of operations of the write driver of FIG. 40.

FIG. 44 is a diagram showing an example of a circuit which produces write control signals.

FIG. 45 is a chart showing operations of the circuit of FIG. 44.

FIG. 46 to FIG. 51 are charts each showing operation timings of an eighth embodiment.

DETAILED DESCRIPTION

In general, according to one embodiment, a nonvolatile semiconductor memory comprises: a resistance-change element having first and second terminals; a transistor having third and fourth terminals and a control terminal, the third terminal being connected to the second terminal; and a first driver electrically connected to the control terminal, applying a first potential to the control terminal in a first write operation, and applying a second potential larger than the first potential to the control terminal in a second write operation.

Embodiments will be hereinafter described with reference to the drawings.

The embodiments are directed to a nonvolatile semiconductor memory having a memory cell in which a resistance-change element and a select transistor (FET) are connected in series, such as an STT-MRAM.

It should be noted that the resistance-change element is an element that can selectively store one of two or more resistance states and includes a magnetoresistive element, a phase-change element and the like. The select transistor is an element for selectively passing a write current through the resistance-change element and is also called an access transistor.

For example, when changing the resistance of the resistance-change element to a first value, the select transistor passes a first current from the resistance-change element to the select transistor. When changing the resistance of the resistance-change element to a second value, the select transistor passes a second current from the select transistor to the resistance-change element.

In the following embodiments, technology of optimizing the first and second currents in such a nonvolatile semiconductor memory without deteriorating the resistance-change element and increasing a write error rate is described.

(First Embodiment)

Figure 1:
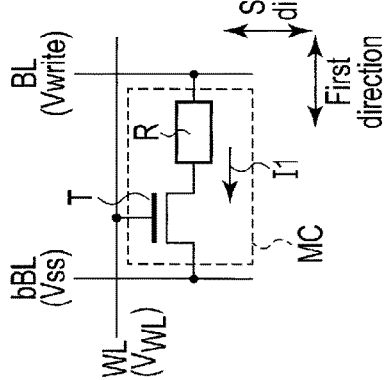
FIG. 1 is a table showing a nonvolatile semiconductor memory of a first embodiment.

FIG. 1 shows a nonvolatile semiconductor memory of the first embodiment.

A memory cell MC is connected between a pair of bit lines BL and bBL. Memory cell MC includes a resistance-change element R and a select transistor (FET) T which are connected in series. The resistance-change element R is arranged on the bit line BL side and the select transistor T is arranged on the bit line bBL side.

For example, bit line bBL arranged on the select transistor T side functions as a source line to which a ground potential is applied in a read operation. Thus, bit line bBL is also called a source line SL.

A control terminal (gate) of the select transistor T is connected to a word line WL. For example, the word line WL extends in a first direction and the pair of bit lines BL and bBL extends in a second direction crossing the first direction.

In such a memory cell MC, for example, in a first write operation for changing the resistance of the resistance-change element R to a first value, the word line WL is set to a select potential $V_{WL}$ ($=V_{WL1}$), bit line BL is set to a write potential (for example, positive potential) Vwrite, and bit line bBL is set to a potential (for example, ground potential) Vss less than the write potential Vwrite.

At this time, the select transistor T passes a first current I1 from the resistance-change element R to the select transistor T. The resistance of the resistance-change element R is changed to, for example, the first value, by the first current I1.

As illustrated, in an equivalent circuit of memory cell MC in the first write operation, the source (S) of the select transistor T is on the bit line bBL side (Vss side) and the drain (D) of the select transistor T is on the resistance-change element R side.

In contrast, in a second write operation for changing the resistance of the resistance-change element R to a second value different from the first value, the word line WL is set to the select potential $V_{WL}$ ($=V_{WL2}$), bit line bBL is set to the write potential (for example, positive potential) Vwrite, and bit line BL is set to potential (for example, ground potential) Vss less than the write potential Vwrite.

At this time, the select transistor T passes a second current I2 from the select transistor T to the resistance-change element R. The resistance of the resistance-change element R is changed to, for example, the second value, by the second current I2.

As illustrated, in an equivalent circuit of memory cell MC in the second write operation, the source (S) of the select transistor T is on the resistance-change element R side and the drain (D) of the select transistor T is on the bit line BL side (Vwrite side).

Figures 2, 3:
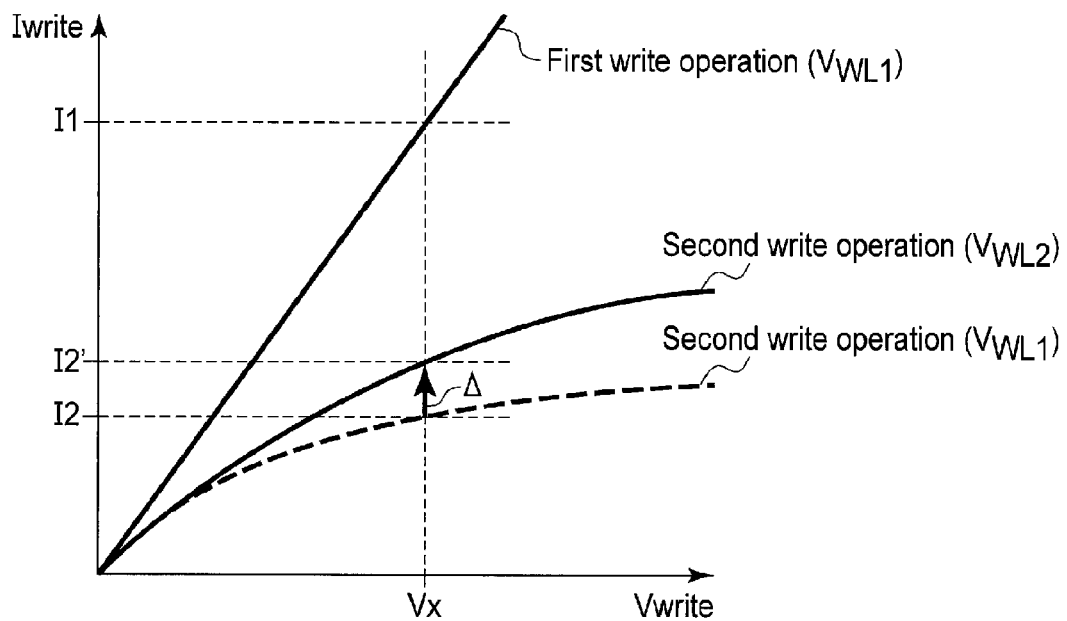
FIG. 2 is a graph showing a relationship between Vwrite and Iwrite using a potential of a word line as a parameter.
FIG. 3 is a table showing a relationship between first and second write operations and the potential of the word line.

On the assumption that a potential of a semiconductor substrate on which the select transistor T is mounted is Vss, the first current I1 is increased in proportion to an increase in voltage between the source (S) and the drain (D) of the select transistor T in the first write operation as shown in FIG. 2. Therefore, it is easy to optimize the first current I1 for changing the resistance of the resistance-change element R to the first value.

In the second write operation, however, a saturation phenomenon occurs. That is, the second current I2 is not sufficiently increased even by increasing the voltage between the source (S) and the drain (D) of the select transistor T. This is because the source (S) potential of the select transistor T is increased by the resistance of the resistance-change element R in the second write operation, which results in the body effect.

Therefore, it is difficult to optimize the second current I2 for changing the resistance of the resistance-change element R to the second value.

To resolve the problem, as shown in FIG. 3, potential $V_{WL}$ ($=V_{WL2}$) of the word line in the second write operation is made greater than potential $V_{WL}$ ($=V_{WL1}$) of the word line in the first write operation. At this time, as shown in FIG. 2, a saturation curve in the case of the second write operation using $V_{WL2}$ (solid line) is shifted by Δ from a saturation curve in the case of the second write operation using $V_{WL1}$ (dashed line) in a direction in which the write current Iwrite is increased.

In other words, on the assumption that the voltage between the source (S) and the drain (D) in the second write operation is Vx, a write current (second current) I2' in the case of the second write operation using $V_{WL2}$ is greater than a write current (second current) I2 in the case of the second write operation using $V_{WL1}$ as shown in FIG. 2.

As a result, the second current I2' for changing the resistance of the resistance-change element R to the second value can be easily optimized.

Since the first and second currents can be optimized as described above, deterioration of the resistance-change element and an increase in write error rate can be prevented in the first and second write operations.

In the above example, potential $V_{WL1}$ of the word line in the first write operation is different from potential $V_{WL2}$ of the word line in the second write operation. However, a memory cell to be subjected to the first write operation and a memory cell to be subjected to the second write operation are generally connected to the same word line.

Therefore, the first and second write operations are executed at different timings. For example, the first write operation may be executed before or after the second write operation. The first and second write operations may be executed continuously (in series) or discontinuously. It should be noted that "continuous" means no time interval (standby time) is provided between the first and second write operations, and "discontinuous" means a time interval is provided between the first and second write operations.

An example of executing the first write operation and the second write operation continuously in this order is hereinafter described.

Figure 4:
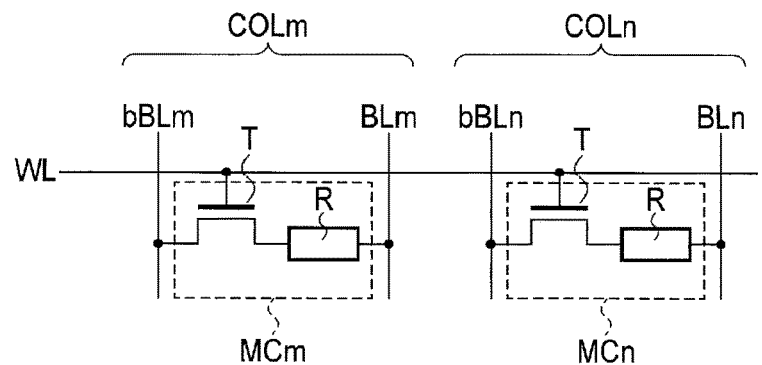
FIG. 4 is a diagram showing memory cells of the nonvolatile semiconductor memory.

FIG. 4 shows memory cells of the nonvolatile semiconductor memory.

A memory cell MCm in a first column COLm is connected between a pair of bit lines BLm and bBLm. Memory cell MCm includes a resistance-change element R and a select transistor (FET) T which are connected in series. The resistance-change element R is arranged on the bit line BLm side and the select transistor T is arranged on the bit line bBLm side.

A memory cell MCn in a second column COLn is connected between a pair of bit lines BLn and bBLn. Memory cell MCn includes a resistance-change element R and a select transistor (FET) T which are connected in series. The resistance-change element R is arranged on the bit line BLn side and the select transistor T is arranged on the bit line bBLn side.

A control terminal (gate) of the select transistor T in memory cell MCm and a control terminal (gate) of the select transistor T in memory cell MCn are connected to a word line WL.

Figure 5:
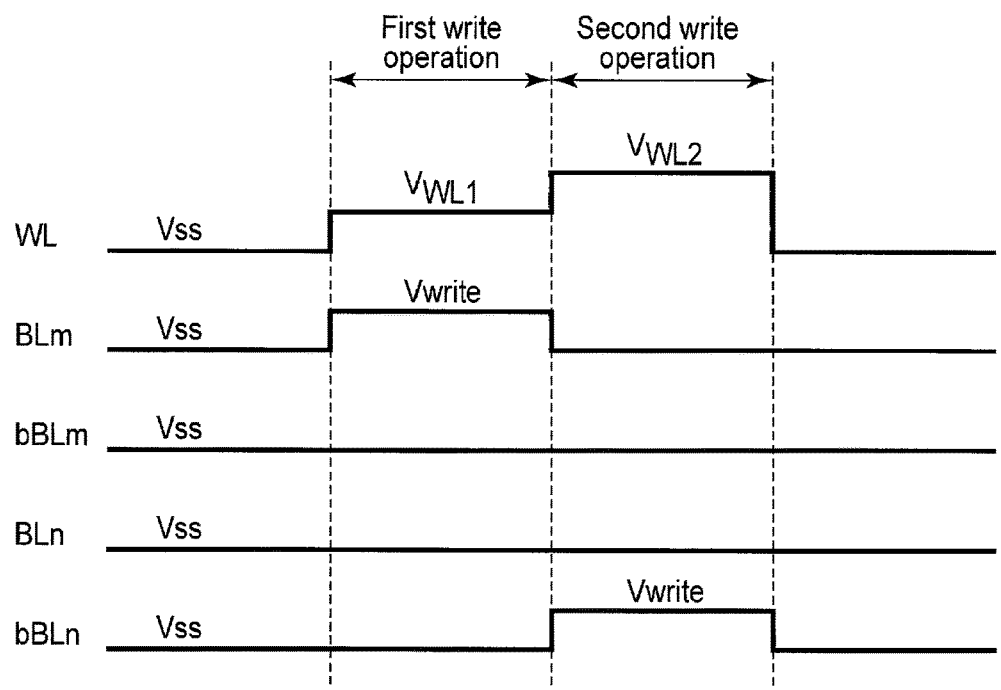
FIG. 5 is a chart showing write operations to the memory cells of FIG. 4.

FIG. 5 shows write operations to the memory cells of FIG. 4.

In the present embodiment, a first write operation for writing first data is executed for memory cell MCm in the first column COLm and a second write operation for writing second data is executed for memory cell MCn in the second column COLn.

It is assumed that in the initial state, the word line WL, the pair of bit lines BLm and bBLm, and the pair of bit lines BLn and bBLn are each set to ground potential Vss.

Figure 6:
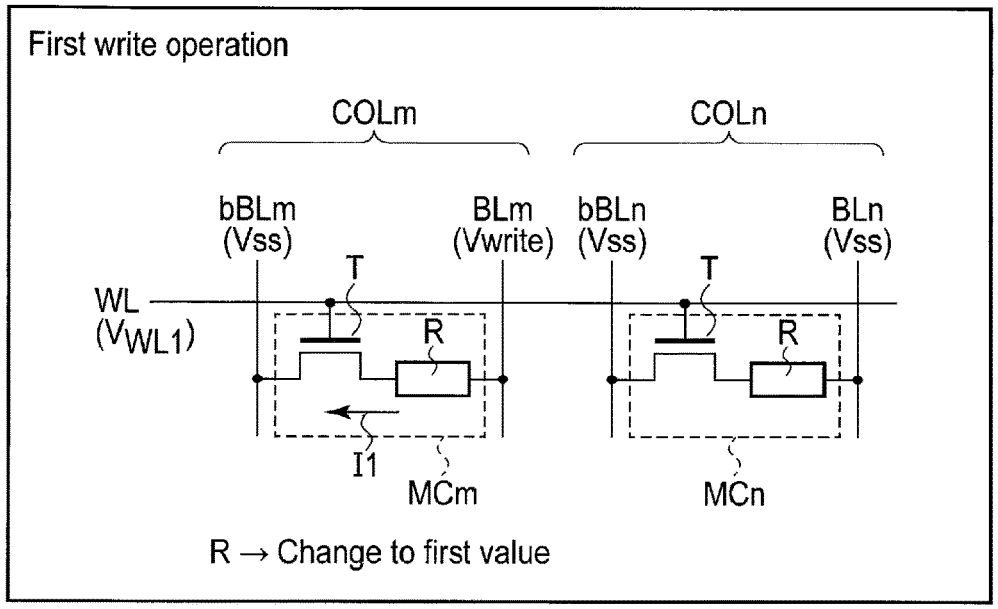
FIG. 6 is a diagram showing a relationship between potentials in a first write operation.

First, the potential of the word line WL is changed from Vss to $V_{WL1}$ (for example, 1.2 V), and the potential of bit line BLm is changed from Vss to Vwrite (for example, 0.6 V). At this time, for example, a first current I1 flows from the resistance-change element R to the select transistor T in memory cell MCm in column COLm as shown in FIG. 6, with the result that a first write operation for changing the resistance-change element R to the first value is executed.

In contrast, since the potential of the pair of bit lines BLn and bBLn is Vss in memory cell MCn in column COLn, no write operation is executed for the resistance-change element R in memory cell MCn when the potential of the word line WL is $V_{WL1}$.

Figure 7:
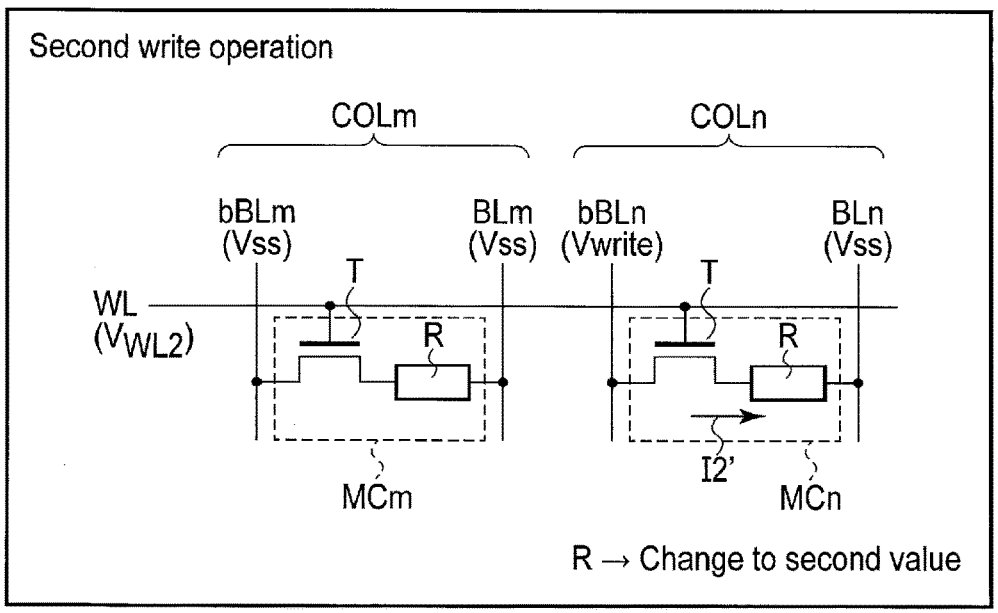
FIG. 7 is a diagram showing a relationship between potentials in a second write operation.

Then, the potential of the word line WL is changed from $V_{WL1}$ to $V_{WL2}$ (for example, 1.4 V), the potential of bit line BLm is changed from Vwrite to Vss, and the potential of bit line bBLn is changed from Vss to Vwrite (for example, 0.6 V). At this time, for example, a second current I2' flows from the select transistor T to the resistance-change element R in memory cell MCn in column COLn as shown in FIG. 7, with the result that a second write operation for changing the resistance-change element R to the second value is executed.

In contrast, since the potential of the pair of bit lines BLm and bBLm is Vss in memory cell MCm in column COLm, no write operation is executed for the resistance-change element R in memory cell MCm when the potential of the word line WL is $V_{WL2}$.

In the first and second write operations, a period of passing the first current I1 through memory cell MCm may be the same as or different from a period of passing the second current I2' through memory cell MCn. For example, these periods can be changed by controlling each of the periods of $V_{WL1}$, $V_{WL2}$ and Vwrite.

In the first embodiment, the potential of the word line is varied according to the directions of the first and second currents (write currents). That is, in a mode in which the source potential of the select transistor is increased (i.e., the second write operation), the first and second currents can be optimized by executing the write operation using potential $V_{WL2}$ of the word line which is greater than normal potential $V_{WL1}$ of the word line.

Therefore, deterioration of the resistance-change elements and an increase in write error rate can be prevented in the first and second write operations. Further, the optimization of the first and second currents reduces power consumption in the write operations. Furthermore, the size of the memory cells can be reduced because there is no need to increase the size of the select transistors.

(Second Embodiment)

The second embodiment relates to a case where the resistance-change element of the first embodiment is a magnetoresistive element. A nonvolatile semiconductor memory comprising a magnetoresistive element as a resistance-change element is called a magnetoresistive random access memory, for example, an STT-MRAM.

Figure 8:
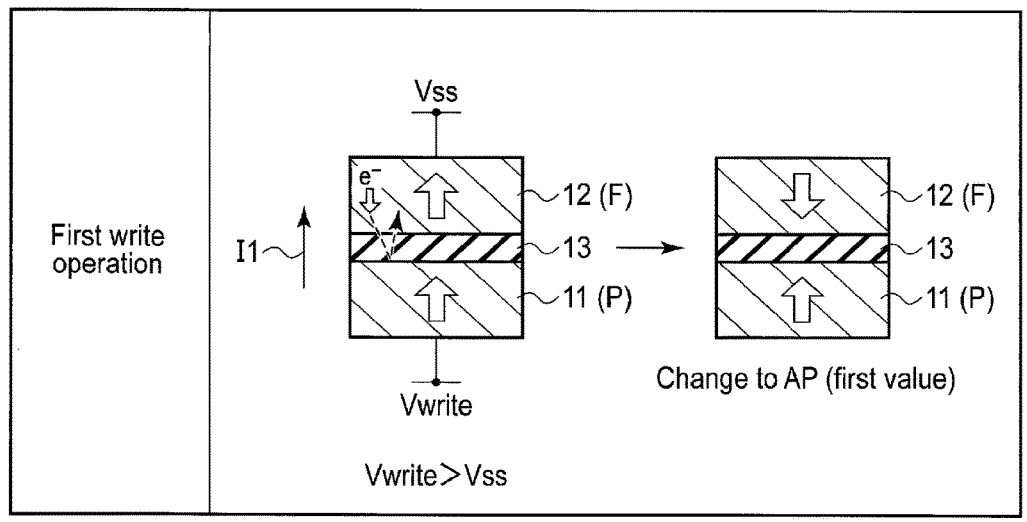
FIG. 8 is a diagram showing a change in state of a resistance-change element in the first write operation.
Figure 9:
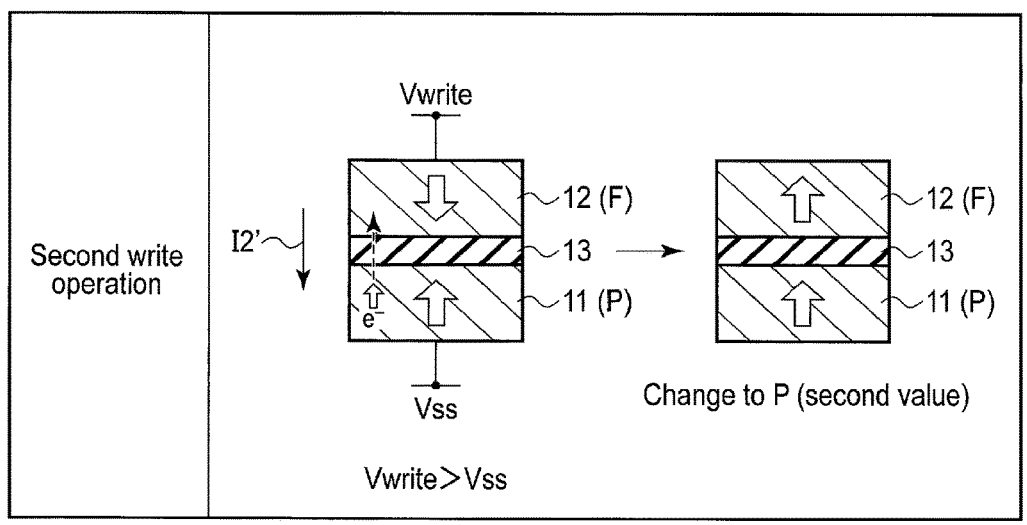
FIG. 9 is a diagram showing a change in state of the resistance-change element in the second write operation.

As shown in FIG. 8 and FIG. 9, the magnetoresistive element comprises, for example, a first magnetic layer (reference layer) 11 with invariable magnetization, a second magnetic layer (storage layer) 12 with variable magnetization and a nonmagnetic layer (tunnel barrier layer) 13 therebetween. In some cases, the first magnetic layer 11 is called a pinned layer (P) and the second magnetic layer 12 is called a free layer (F).

The invariable magnetization means that the direction of magnetization does not vary before and after a write operation, whereas the variable magnetization means that the direction of magnetization can vary in the opposite direction before and after a write operation.

The write operation means spin-transfer write in which spin torque is applied to magnetization of the first magnetic layer (storage layer) 12 by passing a spin-transfer current (spin-polarized electrons) through the magnetoresistive element.

For example, as shown in FIG. 8, when passing a spin-transfer current I1 from the first magnetic layer 11 to the second magnetic layer 12, the electrons that are spin-polarized in the direction opposite to the magnetization of the first magnetic layer 11, which are included in the electrons from the second magnetic layer 12 to the first magnetic layer 11, are returned into the second magnetic layer 12. As a result, the magnetization of the second magnetic layer 12 is subjected to spin torque of the direction opposite to the magnetization of the first magnetic layer 11. Consequently, the magnetoresistive element is changed to an antiparallel state in which the directions of magnetization of the first and second magnetic layers 11 and 12 are opposite to each other.

For example, as shown in FIG. 9, when passing a spin-transfer current I2' from the second magnetic layer 12 to the first magnetic layer 11, the electrons that are spin-polarized in the same direction as the magnetization of the first magnetic layer 11 are injected into the second magnetic layer 12. As a result, the magnetization of the second magnetic layer 12 is subjected to spin torque of the same direction as the magnetization of the first magnetic layer 11. Consequently, the magnetoresistive element is changed to a parallel state in which the directions of magnetization of the first and second magnetic layers 11 and 12 are the same.

In the example of FIG. 8 and FIG. 9, the magnetization of the first and second magnetic layers 11 and 12 has residual magnetization in a direction perpendicular to the film surface, i.e., a direction in which the first and second magnetic layers 11 and 12 are stacked. However, the magnetization of the first and second magnetic layers 11 and 12 may have residual magnetization in a direction parallel to the film surface.

The magnetization of the first magnetic layer 11 is fixed toward the second magnetic layer 12, but may be fixed opposite to the second magnetic layer 12.

For example, such a magnetoresistive element has low resistance in the parallel state and high resistance in the antiparallel state. For example, the parallel state corresponds to a binary 0 state and the antiparallel state corresponds to a binary 1 state.

Spin-transfer current I2' necessary for changing the magnetoresistive element to the antiparallel state is generally greater than spin-transfer current I1 necessary for changing the magnetoresistive element to the parallel state.

Figures 10, 11:
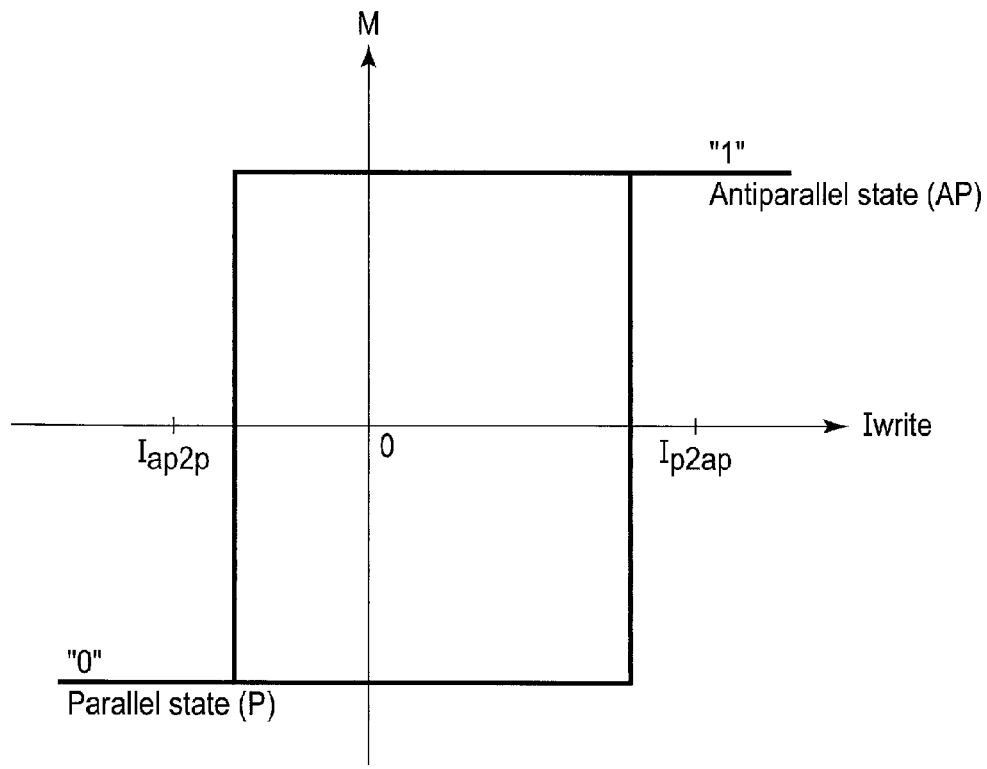
FIG. 10 is a graph showing a hysteresis curve of a resistance-change element of a second embodiment.
FIG. 11 is a table showing a relationship between first and second write operations and a state of the resistance-change element.

That is, a hysteresis curve of the magnetoresistive element serving as the resistance-change element is as shown in FIG. 10. In FIG. 10, the horizontal axis expresses the magnitude of the spin-transfer current as the write current and the vertical axis expresses the direction of residual magnetization of the second magnetic layer 12 as the storage layer. $I_{p2ap}$ corresponds to spin-transfer current I2' necessary for changing the magnetoresistive element to the antiparallel state, and $I_{ap2p}$ corresponds to spin-transfer current I1 necessary for changing the magnetoresistive element to the parallel state.

Considering the above, in the MRAM, the source of the select transistor is on the Vss side in order to facilitate producing a large write current $I_{a2ap}$ (for example, 100 μA) in the antiparallel write operation (1-write operation). Therefore, the write current $I_{a2ap}$ necessary for magnetization reversal can be obtained in the antiparallel write operation.

In this case, however, the source of the select transistor is on the magnetoresistive element side in the parallel write operation (0-write operation). That is, in the parallel write operation, it is difficult to obtain the write current $I_{ap2p}$ necessary for magnetization reversal (for example, 50 μA) because of the body effect (saturation phenomenon of write current) caused by a rise in the source potential of the select transistor.

To resolve the problem, it is preferable that the antiparallel write operation corresponds to the first write operation in the first embodiment and the parallel write operation corresponds to the second write operation in the first embodiment as shown in FIG. 11.

Even if the antiparallel write operation corresponds to the first write operation, the body effect (saturation phenomenon of write current) caused by a rise in the source potential of the select transistor does not occur. Therefore, spin-transfer current $I_{p2ap}$ (=I2') necessary for changing the magnetoresistive element to the antiparallel state can be easily optimized.

If the parallel write operation corresponds to the second write operation, spin-transfer current $I_{ap2p}$ (=I1) necessary for changing the magnetoresistive element to the parallel state can be easily optimized by using potential $V_{WL2}$ of the word line, which is greater than potential $V_{WL1}$ of the word line used in the first write operation, even in case of the body effect (saturation phenomenon of write current) caused by a rise in the source potential of the select transistor.

FIG. 12 shows memory cells of the nonvolatile semiconductor memory.

FIG. 12 corresponds to the memory cells of FIG. 4. In FIG. 12, the same elements as those of FIG. 4 are denoted by the same reference numbers.

A memory cell MCm in a first column COLm is connected between a pair of bit lines BLm and bBLm. Memory cell MCm includes a resistance-change element (magnetoresistive element) R and a select transistor (FET) T which are connected in series. The resistance-change element R is arranged on the bit line BLm side and the select transistor T is arranged on the bit line bBLm side.

The resistance-change element R in memory cell MCm has a stacked layer structure in which a first magnetic layer (reference layer) 11, a nonmagnetic layer (tunnel barrier layer) 13 and a second magnetic layer (storage layer) 12 are stacked from the bit line BLm side to the select transistor T side.

A memory cell MCn in a second column COLn is connected between a pair of bit lines BLn and bBLn. Memory cell MCn includes a resistance-change element (magnetoresistive element) R and a select transistor (FET) T which are connected in series. The resistance-change element R is arranged on the bit line BLn side and the select transistor T is arranged on the bit line bBLn side.

The resistance-change element R in memory cell MCn has a stacked layer structure in which a first magnetic layer (reference layer) 11, a nonmagnetic layer (tunnel barrier layer) 13 and a second magnetic layer (storage layer) 12 are stacked from the bit line BLn side to the select transistor T side.

A control terminal (gate) of the select transistor T in memory cell MCm and a control terminal (gate) of the select transistor T in memory cell MCn are connected to a word line WL.

FIG. 13 shows write operations to the memory cells of FIG. 12.

In the present embodiment, a first write operation for writing first data is executed for memory cell MCm in the first column COLm and a second write operation for writing second data is executed for memory cell MCn in the second column COLn.

It is assumed that in the initial state, the word line WL, the pair of bit lines BLm and bBLm, and the pair of bit lines BLn and bBLn are each set to ground potential Vss.

Figure 14:
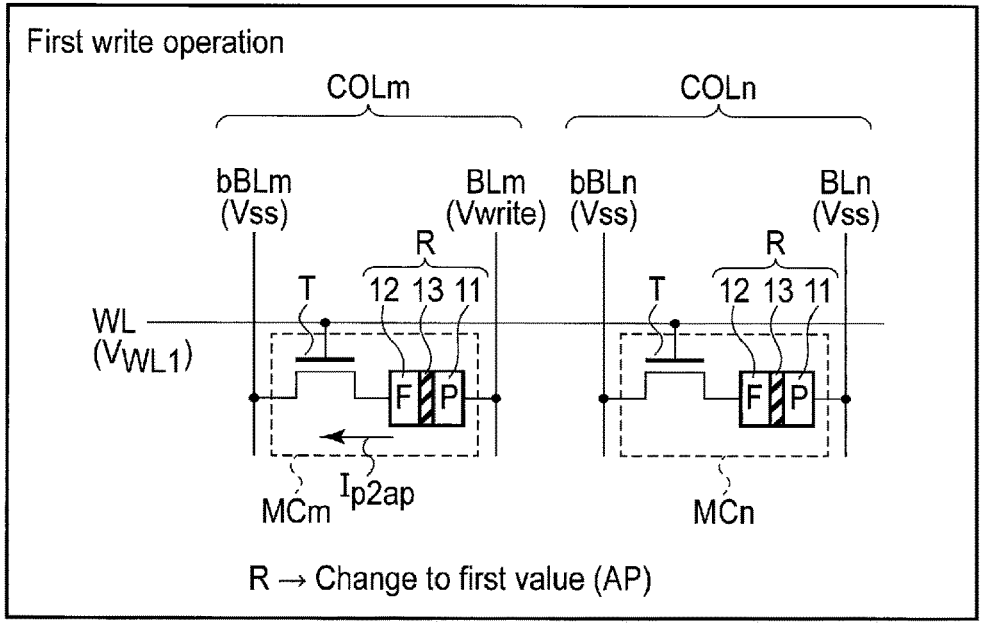
FIG. 14 is a diagram showing a relationship between potentials in the first write operation.

First, the potential of the word line WL is changed from Vss to $V_{WL1}$, and the potential of bit line BLm is changed from Vss to Vwrite. At this time, for example, a first current $I_{p2ap}$ flows from the resistance-change element R to the select transistor T in memory cell MCm in column COLm as shown in FIG. 14. Therefore, for example, the resistance-change element R is changed to the first value (antiparallel state) on the principle of FIG. 8.

In contrast, since the potential of the pair of bit lines BLn and bBLn is Vss in memory cell MCn in column COLn, no write operation is executed for the resistance-change element R in memory cell MCn when the potential of the word line WL is $V_{WL1}$.

Figure 15:
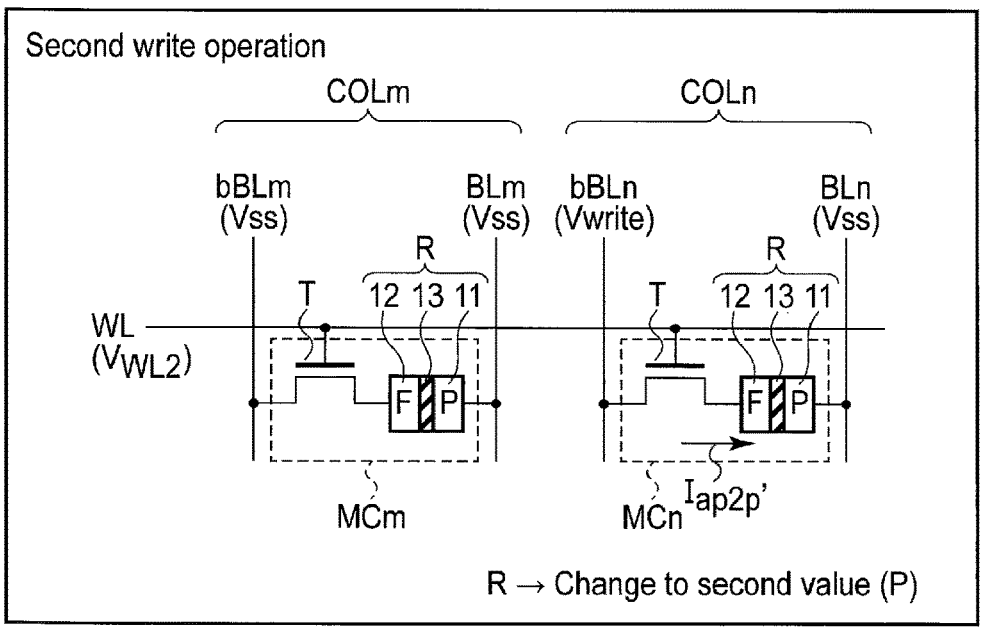
FIG. 15 is a diagram showing a relationship between potentials in the second write operation.

Then, the potential of the word line WL is changed from $V_{WL1}$ to $V_{WL2}$, the potential of bit line BLm is changed from Vwrite to Vss, and the potential of bit line bBLn is changed from Vss to Vwrite. At this time, for example, a second current $I_{ap2p}'$ flows from the select transistor T to the resistance-change element R in memory cell MCn in column COLn as shown in FIG. 15. Therefore, for example, the resistance-change element R is changed to the second value (parallel state) on the principle of FIG. 9.

In contrast, since the potential of the pair of bit lines BLm and bBLm is Vss in memory cell MCm in column COLm, no write operation is executed for the resistance-change element R in memory cell MCm when the potential of the word line WL is $V_{WL2}$.

In the second embodiment, the potential of the word line WL is varied according to the directions of the first and second currents (write currents) $I_{p2ap}$ and $I_{ap2p}'$.

That is, as shown in FIG. 16, potential $V_{WL2}$ of the word line which is greater than potential $V_{WL1}$ of the word line used in the first write operation is used in a mode in which the source potential of the select transistor is increased (i.e., the second write operation). Accordingly, when the write potential Vwrite is Vx, the write current (second current) used in the second write operation is increased from $I_{ap2p}$ to $I_{ap2p}'$.

Therefore, the first and second currents $I_{p2ap}$ and $I_{ap2p}'$ can be optimized.

(Third Embodiment)

The third embodiment is a modified embodiment of the second embodiment. Therefore, in the third embodiment, the same elements as those of the second embodiment are denoted by the same reference numbers and detailed description thereof is omitted.

FIG. 17 shows memory cells of the nonvolatile semiconductor memory.

Compared to the memory cells of FIG. 12, the memory cells of FIG. 17 are characterized by the alignment order of the first magnetic layer (reference layer) 11, the second magnetic layer (storage layer) 12 and the nonmagnetic layer (tunnel barrier layer) 13 in the resistance-change element (magnetoresistive element) R.

That is, the resistance-change element R in memory cell MCm has a stacked layer structure in which the first magnetic layer 11, the nonmagnetic layer 13 and the second magnetic layer 12 are stacked from the select transistor T side to the bit line BLm side. The resistance-change element R in memory cell MCn also has a stacked layer structure in which the first magnetic layer 11, the nonmagnetic layer 13 and the second magnetic layer 12 are stacked from the select transistor T side to the bit line BLn side.

The third embodiment is the same as the second embodiment except for the above point.

FIG. 18 shows write operations to the memory cells of FIG. 17.

In the present embodiment, a first write operation for writing first data is executed for memory cell MCm in the first column COLm and a second write operation for writing second data is executed for memory cell MCn in the second column COLn.

It is assumed that in the initial state, the word line WL, the pair of bit lines BLm and bBLm, and the pair of bit lines BLn and bBLn are each set to ground potential Vss.

First, the potential of the word line WL is changed from Vss to $V_{WL1}$, and the potential of bit line BLm is changed from Vss to Vwrite. At this time, for example, a first current $I_{ap2p}$ flows from the resistance-change element R to the select transistor T in memory cell MCm in column COLm as shown in FIG. 19. Therefore, for example, the resistance-change element R is changed to the first value (parallel state) on the principle of FIG. 9.

In contrast, since the potential of the pair of bit lines BLn and bBLn is Vss in memory cell MCn in column COLn, no write operation is executed for the resistance-change element R in memory cell MCn when the potential of the word line WL is $V_{WL1}$.

Then, the potential of the word line WL is changed from $V_{WL1}$ to $V_{WL2}$, the potential of bit line BLm is changed from Vwrite to Vss, and the potential of bit line bBLn is changed from Vss to Vwrite. At this time, for example, a second current $I_{p2ap}'$ flows from the select transistor T to the resistance-change element R in memory cell MCn in column COLn as shown in FIG. 20. Therefore, for example, the resistance-change element R is changed to the second value (antiparallel state) on the principle of FIG. 8.

In contrast, since the potential of the pair of bit lines BLm and bBLm is Vss in memory cell MCm in column COLm, no write operation is executed for the resistance-change element R in memory cell MCm when the potential of the word line WL is $V_{WL2}$.

In the third embodiment, the potential of the word line WL is varied according to the directions of the first and second currents (write currents) $I_{ap2p}$ and $I_{p2ap}'$.

That is, as shown in FIG. 21, potential $V_{WL2}$ of the word line which is greater than potential $V_{WL1}$ of the word line used in the first write operation is used in a mode in which the source potential of the select transistor is increased (i.e., the second write operation). Accordingly, when the write potential Vwrite is Vx, the write current (second current) used in the second write operation is increased from $I_{p2ap}$ to $I_{p2ap}'$.

Therefore, the first and second currents $I_{ap2p}$ and $I_{p2ap}'$ can be optimized.

(Fourth Embodiment)

The fourth embodiment is a modified embodiment of the second embodiment. Therefore, in the fourth embodiment, the same elements as those of the second embodiment are denoted by the same reference numbers and detailed description thereof is omitted.

FIG. 22 shows memory cells of the nonvolatile semiconductor memory.

Compared to the memory cells of FIG. 12, the memory cells of FIG. 22 are characterized in that the nonvolatile semiconductor memory is a 2-cell/1-bit type in which one bit data is stored in two memory cells. That is, one bit data is stored in, for example, the resistance-change element R in one memory cell MCm in column COLm in the memory cells of FIG. 12, whereas one bit data is stored as complementary data in, for example, two resistance-change elements R in two memory cells MCm and MCm' in column COLm in the memory cells of FIG. 22.

A memory cell MCm in a first column COLm is connected between a pair of bit lines BLm and bBLm. Memory cell MCm includes a resistance-change element (magnetoresistive element) R and a select transistor (FET) T which are connected in series. The resistance-change element R is arranged on the bit line BLm side and the select transistor T is arranged on the bit line bBLm side.

The resistance-change element R in memory cell MCm has a stacked layer structure in which a first magnetic layer (reference layer) 11, a nonmagnetic layer (tunnel barrier layer) 13 and a second magnetic layer (storage layer) 12 are stacked from the bit line BLm side to the select transistor T side.

A memory cell MCm' in the first column COLm is connected between a pair of bit lines BLm' and bBLm'. Memory cell MCm' includes a resistance-change element R and a select transistor T which are connected in series. The resistance-change element R is arranged on the bit line BLm' side and the select transistor T is arranged on the bit line bBLm' side.

The resistance-change element R in memory cell MCm' has a stacked layer structure in which a first magnetic layer 11, a nonmagnetic layer 13 and a second magnetic layer 12 are stacked from the bit line BLm' side to the select transistor T side.

The alignment order of the first and second magnetic layers 11 and 12 of the resistance-change element R in memory cell MCm' is the same as that in memory cell MCm.

A memory cell MCn in a second column COLn is connected between a pair of bit lines BLn and bBLn. Memory cell MCn includes a resistance-change element R and a select transistor T which are connected in series. The resistance-change element R is arranged on the bit line BLn side and the select transistor T is arranged on the bit line bBLn side.

The resistance-change element R in memory cell MCn has a stacked layer structure in which a first magnetic layer 11, a nonmagnetic layer 13 and a second magnetic layer 12 are stacked from the bit line BLn side to the select transistor T side.

A memory cell MCn' in the second column COLn is connected between a pair of bit lines BLn' and bBLn'. Memory cell MCn' includes a resistance-change element R and a select transistor T which are connected in series. The resistance-change element R is arranged on the bit line BLn' side and the select transistor T is arranged on the bit line bBLn' side.

The resistance-change element R in memory cell MCn' has a stacked layer structure in which a first magnetic layer 11, a nonmagnetic layer 13 and a second magnetic layer 12 are stacked from the bit line BLn' side to the select transistor T side.

The alignment order of the first and second magnetic layers 11 and 12 of the resistance-change element R in memory cell MCn' is the same as that in memory cell MCn.

Control terminals (gates) of the select transistors T in memory cells MCm and MCm' and control terminals (gates) of the select transistors T in memory cells MCn and MCn' are connected to a word line WL.

FIG. 23 shows write operations to the memory cells of FIG. 22.

In the present embodiment, a first write operation for writing first data is executed for memory cell MCm in the first column COLm and a second write operation for writing second data is executed for memory cell MCn in the second column COLn.

It is assumed that in the initial state, the word line WL, the pair of bit lines BLm and bBLm, the pair of bit lines BLm' and bBLm', the pair of bit lines BLn and bBLn and the pair of bit lines BLn' and bBLn' are each set to ground potential Vss.

First, the potential of the word line WL is changed from Vss to $V_{WL1}$, and the potential of bit lines BLm and bBLm' is changed from Vss to Vwrite.

At this time, for example, a first current $I1_{p2ap}$ flows from the resistance-change element R to the select transistor T in memory cell MCm in column COLm as shown in FIG. 24. Therefore, for example, the resistance-change element R is changed to the first value (antiparallel state) on the principle of FIG. 8. In memory cell MCm' in column COLm, a first current $I1_{ap2p}$ flows from the select transistor T to the resistance-change element R. Therefore, for example, the resistance-change element R is changed to the second value (parallel state) on the principle of FIG. 9.

In contrast, since the potential of the pair of bit lines BLn and bBLn and the pair of bit lines BLn' and bBLn' is Vss in memory cells MCn and MCn' in column COLn, no write operation is executed for the resistance-change elements R in memory cells MCn and MCn' when the potential of the word line WL is $V_{WL1}$. Then, the potential of the word line WL is changed from $V_{WL1}$ to $V_{WL2}$, the potential of bit lines BLm and bBLm' is changed from Vwrite to Vss, and the potential of bit lines bBLn and BLn' is changed from Vss to Vwrite.

At this time, for example, a second current $I2_{ap2p}'$ flows from the select transistor T to the resistance-change element R in memory cell MCn in column COLn as shown in FIG. 25. Therefore, for example, the resistance-change element R is changed to the second value (parallel state) on the principle of FIG. 9. In memory cell MCn' in column COLn, a second current $I2_{p2ap}'$ flows from the resistance-change element R to the select transistor T. Therefore, for example, the resistance-change element R is changed to the first value (antiparallel state) on the principle of FIG. 8.

In contrast, since the potential of the pair of bit lines BLm and bBLm and the pair of bit lines BLm' and bBLm' is Vss in memory cells MCm and MCm' in column COLm, no write operation is executed for the resistance-change elements R in memory cells MCm and MCm' when the potential of the word line WL is $V_{WL2}$.

In the fourth embodiment, $V_{WL1}$ is used as the potential of the word line in the first write operation as shown in FIG. 26.

At this time, since a mode in which the source potential of the select transistor T is increased (saturation phenomenon of write current) does not occur in memory cell MCm, the antiparallel write operation can be executed by using the first current (write current) $I1_{p2ap}$ optimized by the write potential Vwrite (=Vx).

The mode in which the source potential of the select transistor T is increased occurs in memory cell MCm', but the parallel write operation requires a small write current and thus can be executed by using the first current (write current) $I1_{ap2p}$ optimized by the write potential Vwrite (=Vx).

In contrast, the mode in which the source potential of the select transistor T is increased occurs in memory cell MCn in the second write operation as shown in FIG. 27. However, $V_{WL2}$ which is greater than $V_{WL1}$ is used as the potential of the word line in the second write operation. That is, the second current (write current) flowing through memory cell MCn is increased from $I2_{ap2p}$ to $I_{ap2p}'$.

Therefore, the parallel write operation can be executed by using the second current $I2_{ap2p}'$ optimized by the write potential VwriLe (=Vx).

In the second write operation, the mode in which the source potential of the select transistor T is increased does not occur in memory cell MCn'. In addition, $V_{WL2}$ which is greater than $V_{WL1}$ is used as the potential of the word line in the second write operation. That is, the second current (write current) flowing through memory cell MCn' is increased from $I2_{ap2p}$ to $I_{p2ap}'$.

Therefore, the antiparallel write operation can be executed by using the second current $I2_{p2ap}'$ optimized by the write potential Vwrite (=Vx).

(Fifth Embodiment)

The fifth embodiment is a modified embodiment of the fourth embodiment. Therefore, in the fifth embodiment, the same elements as those of the fourth embodiment are denoted by the same reference numbers and detailed description thereof is omitted.

FIG. 28 shows memory cells of the nonvolatile semiconductor memory.

The memory cells of FIG. 28 are the same as the memory cells of FIG. 22 in that the nonvolatile semiconductor memory is a 2-cell/1-bit type in which one bit data is stored in two memory cells, and different from the memory cells of FIG. 22 in that a bit line (source line) is shared by select transistors T.

A memory cell MCm in a first column COLm is connected between a pair of bit lines BLm and bBLm (bBLm'). Memory cell MCm includes a resistance-change element (magnetoresistive element) R and a select transistor (FET) T which are connected in series. The resistance-change element R is arranged on the bit line BLm side and the select transistor T is arranged on the bit line bBLm (bBLm') side.

The resistance-change element R in memory cell MCm has a stacked layer structure in which a first magnetic layer (reference layer) 11, a nonmagnetic layer (tunnel barrier layer) 13 and a second magnetic layer (storage layer) 12 are stacked from the bit line BLm side to the select transistor T side.

A memory cell MCm' in the first column COLm is connected between a pair of bit lines BLm' and bBLm (bBLm'). Memory cell MCm' includes a resistance-change element R and a select transistor T which are connected in series. The resistance-change element R is arranged on the bit line BLm' side and the select transistor T is arranged on the bit line bBLm (bBLm') side.

The resistance-change element R in memory cell MCm' has a stacked layer structure in which a second magnetic layer 12, a nonmagnetic layer 13 and a first magnetic layer 11 are stacked from the bit line BLm' side to the select transistor T side.

The alignment order of the first and second magnetic layers 11 and 12 of the resistance-change element R in memory cell MCm' is opposite to that in memory cell MCm.

A memory cell MCn in a second column COLn is connected between a pair of bit lines BLn and bBLn (bBLn'). Memory cell MCn includes a resistance-change element R and a select transistor T which are connected in series. The resistance-change element R is arranged on the bit line BLn side and the select transistor T is arranged on the bit line bBLn (bBLn') side.

The resistance-change element R in memory cell MCn has a stacked layer structure in which a first magnetic layer 11, a nonmagnetic layer 13 and a second magnetic layer 12 are stacked from the bit line BLn side to the select transistor T side.

A memory cell MCn' in the second column COLn is connected between a pair of bit lines BLn' and bBLn (bBLn'). Memory cell MCn' includes a resistance-change element R and a select transistor T which are connected in series. The resistance-change element R is arranged on the bit line BLn' side and the select transistor T is arranged on the bit line bBLn (bBLn') side.

The resistance-change element R in memory cell MCn' has a stacked layer structure in which a second magnetic layer 12, a nonmagnetic layer 13 and a first magnetic layer 11 are stacked from the bit line BLn' side to the select transistor T side.

The alignment order of the first and second magnetic layers 11 and 12 of the resistance-change element R in memory cell MCn' is opposite to that in memory cell MCn.

Control terminals (gates) of the select transistors T in memory cells MCm and MCm' and control terminals (gates) of the select transistors T in memory cells MCn and MCn' are connected to a word line WL.

FIG. 29 shows write operations to the memory cells of FIG. 28.

In the present embodiment, a first write operation for writing first data is executed for memory cell MCm in the first column COLm and a second write operation for writing second data is executed for memory cell MCn in the second column COLn.

It is assumed that in the initial state, the word line WL, the pair of bit lines BLm and bBLm (bBLM'), the pair of bit lines BLm' and bBLm (bBLM'), the pair of bit lines BLn and bBLn (bBLn') and the pair of bit lines BLn' and bBLn (bBLn') are each set to ground potential Vss.

First, the potential of the word line WL is changed from Vss to $V_{WL1}$, and the potential of bit lines BLm and BLm' is changed from Vss to Vwrite.

At this time, for example, a first current $I1_{p2ap}$ flows from the resistance-change element R to the select transistor T in memory cell MCm in column COLm as shown in FIG. 30. Therefore, for example, the resistance-change element R is changed to the first value (antiparallel state) on the principle of FIG. 8. In memory cell MCm' in column COLm, a first current $I1_{ap2p}$ flows from the resistance-change element R to the select transistor T. Therefore, for example, the resistance-change element R is changed to the second value (parallel state) on the principle of FIG. 9.

In contrast, since the potential of the pair of bit lines BLn and bBLn (bBLn') and the pair of bit lines BLn' and bBLn (bBLn') is Vss in memory cells MCn and MCn' in column COLn, no write operation is executed for the resistance-change elements R in memory cells MCn and MCn' when the potential of the word line WL is $V_{WL1}$.

Then, the potential of the word line WL is changed from $V_{WL1}$ to $V_{WL2}$, the potential of bit lines BLm and BLm' is changed from Vwrite to Vss, and the potential of bit line bBLn (bBLn') is changed from Vss to Vwrite.

At this time, for example, a second current $I2_{ap2p}'$ flows from the select transistor T to the resistance-change element R in memory cell MCn in column COLn as shown in FIG. 31. Therefore, for example, the resistance-change element R is changed to the second value (parallel state) on the principle of FIG. 9. In memory cell MCn' in column COLn, a second current $I2_{p2ap}'$ flows from the select transistor T to the resistance-change element R. Therefore, for example, the resistance-change element R is changed to the first value (antiparallel state) on the principle of FIG. 8.

In contrast, since the potential of the pair of bit lines BLm and bBLm (bBLm') and the pair of bit lines BLm' and bBLm (bBLm') is Vss in memory cells MCm and MCm' in column COLm, no write operation is executed for the resistance-change elements R in memory cells MCm and MCm' when the potential of the word line WL is $V_{WL2}$.

In the fifth embodiment, $V_{WL1}$ is used as the potential of the word line in the first write operation as shown in FIG. 32.

At this time, since the mode in which the source potential of the select transistor T is increased (saturation phenomenon of write current) does not occur in each of the two memory cells MCm and MCm', the antiparallel/parallel write operations can be executed by using the first currents (write currents) $I1_{p2ap}$ and $I1_{ap2p}$ optimized by the write potential Vwrite (=Vx).

In contrast, the mode in which the source potential of the select transistor T is increased occurs in each of the two memory cells MCn and MCn' in the second write operation as shown in FIG. 33. However, $V_{WL2}$ which is greater than $V_{WL1}$ is used as the potential of the word line in the second write operation. That is, the second current (write current) flowing through memory cell MCn is increased from $I2_{ap2p}$ to $I_{ap2p}'$, and the second current (write current) flowing through memory cell MCn' is increased from $I2_{p2ap}$ to $I_{p2ap}'$.

Therefore, the parallel/antiparallel write operations can be executed by using the second currents $I2_{ap2p}'$ and $I2_{p2ap}'$ optimized by the write potential Vwrite (=Vx).

(Sixth Embodiment)

The sixth embodiment is a modified embodiment of the fifth embodiment. Therefore, in the sixth embodiment, the same elements as those of the fifth embodiment are denoted by the same reference numbers and detailed description thereof is omitted.

FIG. 34 shows memory cells of the nonvolatile semiconductor memory.

The memory cells of FIG. 34 are the same as the memory cells of FIG. 28 in that the nonvolatile semiconductor memory is a 2-cell/1-bit type in which one bit data is stored in two memory cells, and different from the memory cells of FIG. 28 in that a select transistor is shared by two memory cells.

A memory cell MCm in a first column COLm is connected between a pair of bit lines BLm and bBLm (bBLm'). Memory cell MCm includes a resistance-change element (magnetoresistive element) R and a shared select transistor (FET) T which are connected in series. The resistance-change element R is arranged on the bit line BLm side and the shared select transistor T is arranged on the bit line bBLm (bBLm') side.

The resistance-change element R in memory cell MCm has a stacked layer structure in which a first magnetic layer (reference layer) 11, a nonmagnetic layer (tunnel barrier layer) 13 and a second magnetic layer (storage layer) 12 are stacked from the bit line BLm side to the shared select transistor T side.

A memory cell MCm' in the first column COLm is connected between a pair of bit lines BLm' and bBLm (bBLm'). Memory cell MCm' includes a resistance-change element R and the shared select transistor T which are connected in series. The resistance-change element R is arranged on the bit line BLm' side and the shared select transistor T is arranged on the bit line bBLm (bBLm') side.

The resistance-change element R in memory cell MCm' has a stacked layer structure in which a second magnetic layer 12, a nonmagnetic layer 13 and a first magnetic layer 11 are stacked from the bit line BLm' side to the select transistor T side.

The alignment order of the first and second magnetic layers 11 and 12 of the resistance-change element R in memory cell MCm' is opposite to that in memory cell MCm.

A memory cell MCn in a second column COLn is connected between a pair of bit lines BLn and bBLn (bBLn'). Memory cell MCn includes a resistance-change element R and a shared select transistor T which are connected in series. The resistance-change element R is arranged on the bit line BLn side and the shared select transistor T is arranged on the bit line bBLn (bBLn') side.

The resistance-change element R in memory cell MCn has a stacked layer structure in which a first magnetic layer 11, a nonmagnetic layer 13 and a second magnetic layer 12 are stacked from the bit line BLn side to the shared select transistor T side.

A memory cell MCn' in the second column COLn is connected between a pair of bit lines BLn' and bBLn (bBLn'). Memory cell MCn' includes a resistance-change element R and the shared select transistor T which are connected in series. The resistance-change element R is arranged on the bit line BLn' side and the shared select transistor T is arranged on the bit line bBLn (bBLn') side.

The resistance-change element R in memory cell MCn' has a stacked layer structure in which a second magnetic layer 12, a nonmagnetic layer 13 and a first magnetic layer 11 are stacked from the bit line BLn' side to the shared select transistor T side.

The alignment order of the first and second magnetic layers 11 and 12 of the resistance-change element R in memory cell MCn' is opposite to that in memory cell MCn.

A control terminal (gate) of the select transistor T in memory cells MCm and MCm' and a control terminal (gate) of the select transistor T in memory cells MCn and MCn' are connected to a word line WL.

Write operations to the memory cells of FIG. 34 in the sixth embodiment is the same as those in the fifth embodiment (FIG. 29 to FIG. 33) and thus description of the write operations is omitted.

The same effect as the fifth embodiment can be achieved by the sixth embodiment.

That is, first currents (write currents) $I1_{p2ap}$ and $I1_{ap2p}$ optimized by the write potential Vwrite (=Vx) can be produced in the first write operation as shown in FIG. 32. Second currents $I2_{ap2p}'$ and $I2_{p2ap}'$ optimized by the write potential Vwrite (=Vx) can also be produced in the second write operation as shown in FIG. 33.

(Seventh Embodiment)

The seventh embodiment relates to technology of controlling the potentials of word lines and bit lines in the first to sixth embodiments.

FIG. 35 shows a memory cell array of the nonvolatile semiconductor memory.

The memory cell array 20 comprises an array of memory cells MC. Memory cells MC corresponds to, for example, the memory cells (FIG. 12) of the second embodiment.

Word line drivers 21-0, 21-1, . . . , 21-i, . . . , 21-j are connected to word lines WL0, WL1, . . . , WLi, . . . , WLj, respectively. Word line drivers 21-0, 21-1, . . . , 21-i, . . . 21-j controls the potentials of word lines WL0, WL1, . . . , WLi, . . . , WLj based on an address signal ADD. The address signal ADD is input to word line drivers 21-0, 21-1, . . . , 21-i, . . . , 21-j through a demultiplexer 22.

Write drivers 23-0, 23-1, . . . , 23-m, . . . , 21-n are connected to bit line pairs BL0 and bBL0, BL1 and bBL1, . . . , BLm and bBLm, . . . , BLn and bBLn, respectively. Write drivers 23-0, 23-1, . . . , 23-m, 21-n controls the potentials of bit line pairs BL0 and bBL0, BL1 and bBL1, . . . , BLm and bBLm, . . . , BLn and bBLn, based on data temporarily stored in sense amplifiers 24-0, 24-1, . . . , 24-m, . . . , 24-n, respectively.

For example, a timing circuit 25 produces write control signals WEN1 and WEN2 based on a write enable signal WE. Write control signals WEN1 and WEN2 control timings of $V_{WL1}$, $V_{WL2}$ and Vwrite described in the first to sixth embodiments.

FIG. 36 shows an example of the word line driver.

The word line driver in this example corresponds to word line driver 21-i of FIG. 35. It should be noted that the word line drivers of FIG. 35 other than 21-*i* have the same structure as word line driver 21-*i* of this example.

The address signal ADD is input to an AND gate circuit 31. When word line WLi is selected, all bits of the address signal ADD input to the AND gate circuit 31 in word line driver 21-*i* become binary 1. Therefore, an output signal A of the AND gate circuit 31 is binary 1. The output signal A of the AND gate circuit 31 is input to buffer circuits 32 and 33.

Buffer circuits 32 and 33 are enabled by write control signals WEN1 and WEN2.

For example, buffer circuit 32 is enabled when write control signal WEN1 is binary 1 and disabled when write control signal WEN1 is binary 0. When buffer circuit 32 is enabled, buffer circuit 32 outputs $V_{WL1}$ to word line WLi on the condition that the input signal A is binary 1.

Buffer circuit 32 can be implemented by, for example, a circuit shown in FIG. 37.

In this example, buffer circuit 32 comprises P-channel FETs P1 and P2 and N-channel FETs N1 and N2 which are connected in series between a first terminal ($V_{WL1}$) and a second terminal (Vss). An inverted signal bA of the input signal A (i.e., an output signal of an inverter I1) is input to the gate of P-channel FET P1 and the gate of N-channel FET N1, and an output signal B is output from the drain of P-channel FET P1 and the drain of N-channel FET N1.

Write control signal WEN1 is input to the gate of N-channel FET N2, and an inverted signal of write control signal WEN1 (i.e., an output signal of an inverter I2) is input to the gate of P-channel FET P2.

For example, buffer circuit 33 is enabled when write control signal WEN2 is binary 1 and disabled when write control signal WEN2 is binary 0. When buffer circuit 33 is enabled, buffer circuit 33 outputs $V_{WL2}$ to word line WLi on the condition that the input signal A is binary 1.

Buffer circuit 33 can be implemented by, for example, a circuit shown in FIG. 38.

In this example, buffer circuit 33 comprises P-channel FETs P1 and P2 and N-channel FETs N1 and N2 which are connected in series between a first terminal ($V_{WL2}$) and a second terminal (Vss). An inverted signal bA of the input signal A (i.e., an output signal of an inverter I1) is input to the gate of P-channel FET P1 and the gate of N-channel FET N1, and an output signal B is output from the drain of P-channel FET P1 and the drain of N-channel FET N1.

Write control signal WEN2 is input to the gate of N-channel FET N2, and an inverted signal of write control signal WEN2 (i.e., an output signal of an inverter I2) is input to the gate of P-channel FET P2.

An output signal of a NOR gate circuit 34 is binary 0 when one of write control signals WEN1 and WEN2 is binary 1, and is binary 1 when both write control signals WEN1 and WEN2 are binary 0. A switch element 35 is in the off-state when the output signal of the NOR gate circuit 34 is binary 0, and is in the on-state when the output signal of the NOR gate circuit 34 is binary 1.

When the switch element 35 is in the on-state, word line WLi is reset to, for example, ground potential Vss.

FIG. 39 shows a summary of operations of the word line driver of FIG. 36.

The potential of word line WLi is one of $V_{WL1}$ and $V_{WL2}$ when word line WLi is selected, and is Vss when word line WLi is not selected.

FIG. 40 shows an example of the write driver.

The write driver in this example corresponds to write driver 23-*m* of FIG. 35. It should be noted that the write drivers of FIG. 35 other than 23-*m* have the same structure as write driver 23-*m* of this example.

Memory cell MC corresponds to, for example, the memory cells (FIG. 12) of the second embodiment.

Write control signal WEN1 and data (write data) DATA are input to an AND gate circuit 41. When both write control signal WEN1 and the data DATA are binary 1, the AND gate circuit 41 outputs binary 1. Except for the above case, the AND gate circuit 41 outputs binary 0.

Switch elements 42 and 43 are in the on-state when the output signal of the AND gate circuit 41 is binary 1 and are in the off-state when the output signal of the AND gate circuit 41 is binary 0. When switch elements 42 and 43 are in the on-state, for example, the first current (write current) $I1_{p2ap}$ flows into memory cell MC and the resistance-change element R is changed to the antiparallel state (binary 1 state) as shown in FIG. 41.

Write control signal WEN2 and an inverted signal bDATA of the data DATA are input to an AND gate circuit 44. The AND gate circuit 44 outputs binary 1 when write control signal WEN2 is binary 1 and the data DATA is binary 0, i.e., when both write control signal WEN2 and the inverted signal bDATA of the data DATA are binary 1. Except for the above case, the AND gate circuit 44 outputs binary 0.

Switch elements 45 and 46 are in the on-state when the output signal of the AND gate circuit 44 is binary 1 and are in the off-state when the output signal of the AND gate circuit 44 is binary 0. When switch elements 45 and 46 are in the on-state, for example, the second current (write current) $I2_{ap2p}'$ flows into memory cell MC and the resistance-change element R is changed to the parallel state (binary 0 state) as shown in FIG. 42.

FIG. 43 shows a summary of operations of the write driver of FIG. 40.

In the 1-write operation, write control signal WEN1 is binary 1 and write control signal WEN2 is binary 0. In a memory cell selected as a target of the 1-write operation, DATA is binary 1 and thus the write current Iwrite flows from bit line BLm to bit line bBLm. Accordingly, the resistance-change element R is changed to the antiparallel state (binary 1 state).

In contrast, in a memory cell not selected as a target of the 1-write operation, DATA is binary 0 and thus the write current Iwrite does not flow and the resistance of the resistance-change element R is not changed.

In the 0-write operation, write control signal WEN1 is binary 0 and write control signal WEN2 is binary 1. In a memory cell selected as a target of the 0-write operation, bDATA is binary 1 and thus the write current Iwrite flows from bit line bBLm to bit line BLm. Accordingly, the resistance-change element R is changed to the parallel state (binary 0 state).

In contrast, in a memory cell not selected as a target of the 0-write operation, bDATA is binary 0 and thus the write current Iwrite does not flow and the resistance of the resistance-change element R is not changed.

FIG. 44 shows an example of a circuit which produces write control signals.

Write control signals WEN1 and WEN2 can be produced by using, for example, a delay circuit 51, based on a write enable signal WE. More specifically, write control signals WEN1 and WEN2 can be produced by changing the amount of delay in the delay circuit 51 as shown in FIG. 45.

Write control signals WEN1 and WEN2 are continuous in FIG. 45, but it is also possible to provide a time interval (standby time) between write control signals WEN1 and WEN2 or make write control signals WEN1 and WEN2 partially overlap each other by changing the amount of delay in the delay circuit 51.

(Eighth Embodiment)

The eighth embodiment relates to operation timings of the nonvolatile semiconductor memory of the first to seventh embodiments. In the present embodiment, an example of timings of changing the potentials of word and bit lines will be described with the inclusion of the relationship between write control signals WEN1 and WEN2 described in the seventh embodiment.

Figure 46:
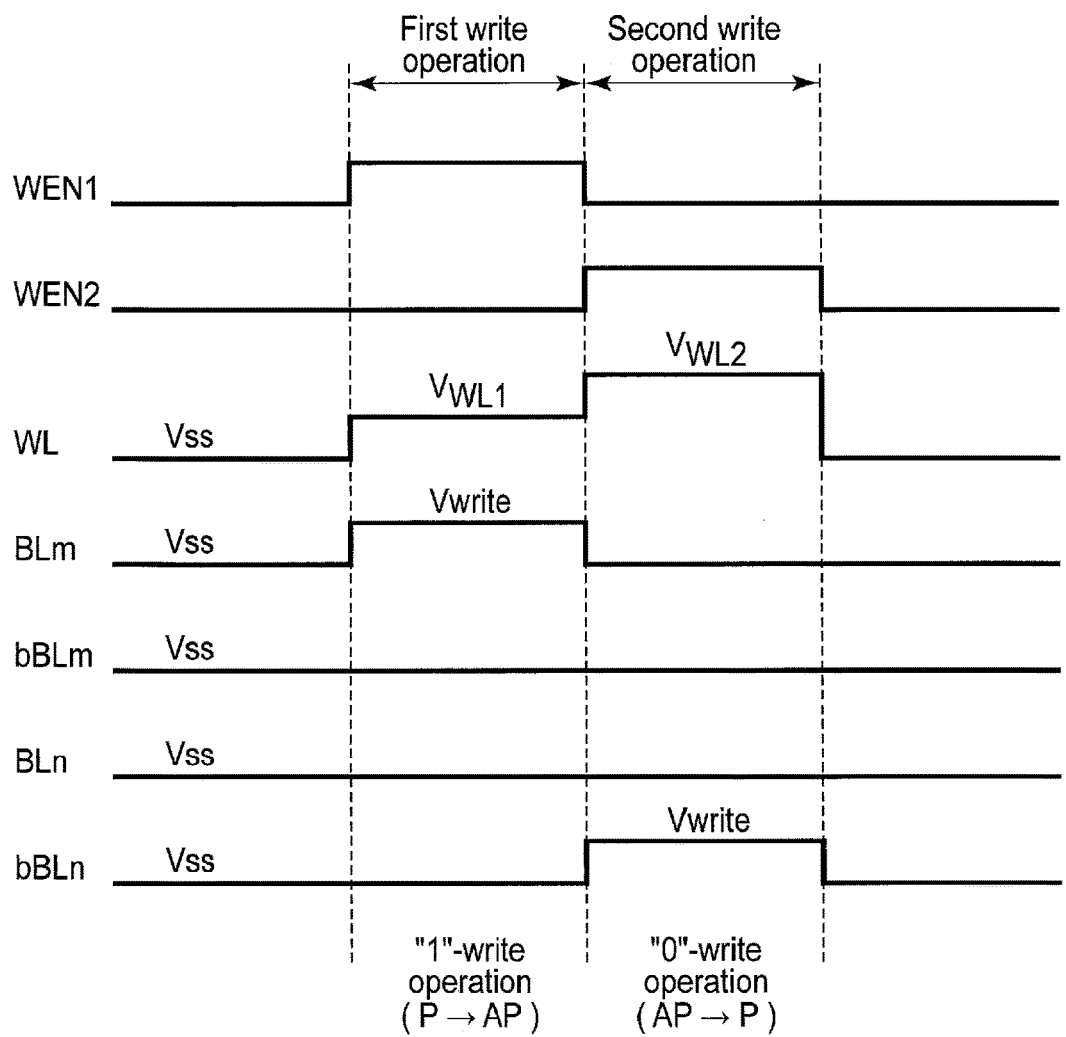

FIG. 46 shows a first example of the operation timings.

In the first example, the 1-write operation (parallel→antiparallel) and the 0-write operation (antiparallel→parallel) are continuously executed in this order.

First, as write control signal WEN1 is changed to binary 1, word line WL is set to $V_{WL1}$ and bit line BLm is set to Vwrite. As a result, the first write operation (1-write operation) is executed.

Next, as write control signal WEN2 is changed to binary 1, word line WL is set to $V_{WL2}$ and bit line bBLn is set to Vwrite. As a result, the second write operation (0-write operation) is executed.

FIG. 47 shows a second example of the operation timings.

In the second example, the 0-write operation (antiparallel→parallel) and the 1-write operation (parallel→antiparallel) are continuously executed in this order.

First, as write control signal WEN2 is changed to binary 1, word line WL is set to $V_{WL2}$ and bit line bBLn is set to Vwrite. As a result, the second write operation (0-write operation) is executed.

Next, as write control signal WEN1 is changed to binary 1, word line WL is set to $V_{WL1}$ and bit line BLm is set to Vwrite. As a result, the first write operation (1-write operation) is executed.

FIG. 48 shows a third example of the operation timings.

In the third example, the 1-write operation (parallel→antiparallel) is first executed and the 0-write operation (antiparallel→parallel) is executed after a standby time.

First, as write control signal WEN1 is changed to binary 1, word line WL is set to $V_{WL1}$ and bit line BLm is set to Vwrite. As a result, the first write operation (1-write operation) is executed.

The standby time is provided after the first write operation.

Next, write control signal WEN2 is changed to binary 1 on the condition that the standby time expires. In response, word line WL is set to $V_{WL2}$ and bit line bBLn is set to Vwrite. As a result, the second write operation (0-write operation) is executed.

FIG. 49 shows a fourth example of the operation timings.

The fourth example is characterized in that write control signals WEN1_WL and WEN2_WL for controlling word line drivers are different from write control signals WEN1_BL and WEN2_BL for controlling write drivers.

First, word line WL is set to $V_{WL1}$ as write control signal WEN1_WL is changed to binary 1, and bit line BLm is set to Vwrite as write control signal WEN1_BL is changed to binary 1. As a result, the first write operation (1-write operation) is executed.

In the first write operation, the pulse width of write control signal WEN1_WL is different from that of write control signal WEN1_BL. Therefore, a period during which $V_{WL1}$ is applied to word line WL is different from a period during which Vwrite is applied to bit line BLm.

The period during which Vwrite is applied to bit line BLm should preferably be longer than the period during which $V_{WL1}$ is applied to word line WL as in this example.

Next, word line WL is set to $V_{WL2}$ as write control signal WEN2_WL is changed to binary 1, and bit line bBLn is set to Vwrite as write control signal WEN2_BL is changed to binary 1. As a result, the second write operation (0-write operation) is executed.

In the second write operation, too, the pulse width of write control signal WEN2_WL is different from that of write control signal WEN2_BL. Therefore, a period during which $V_{WL2}$ is applied to word line WL is different from a period during which Vwrite is applied to bit line bBLn.

The period during which Vwrite is applied to bit line bBLn should preferably be longer than the period during which $V_{WL2}$ is applied to word line WL as in this example.

FIG. 50 shows a fifth example of the operation timings.

The fifth example is characterized in that the period of the first write operation is different from the period of the second write operation in the first example (FIG. 46).

First, as write control signal WEN1 is changed to binary 1, word line WL is set to $V_{WL1}$ and bit line BLm is set to Vwrite. As a result, the first write operation (1-write operation) is executed.

Next, as write control signal WEN2 is changed to binary 1, word line WL is set to $V_{WL2}$ and bit line bBLn is set to Vwrite. As a result, the second write operation (0-write operation) is executed.

A write current used in the second write operation is less than a write current used in the first write operation. Therefore, the period of the second write operation should preferably be longer than the period of the first write operation in order to ensure the completion of the 0-write operation.

FIG. 51 shows a sixth example of the operation timings.

In the same manner as the fifth example (FIG. 50), the sixth example is characterized in that the period of the first write operation is different from the period of the second write operation. In the sixth example, the periods of the first and second write operations are made different from each other by making part of the period of the second write operation overlap the first write operation.

First, word line WL is set to $V_{WL1}$ as write control signal WEN1_WL is changed to binary 1, and bit lines BLm and bBLn are set to Vwrite as write control signals WEN1_BL and WEN2_BL are changed to binary 1. As a result, the first write operation (1-write operation) is executed.

The sixth example is different from the fifth example in that the second write operation is executed together with the first write operation. However, the 0-write operation cannot be completed reliably because word line WL is $V_{WL1}$ in the second write operation at this time.

Next, word line WL is set to $V_{WL2}$ as write control signal WEN2_WL is changed to binary 1. At this time, bit line bBLn is maintained at Vwrite because write control signal WEN2_BL maintains binary 1. As a result, the second write operation (0-write operation) is executed.

Since the second write operation is executed in both the case where the potential of word line WL is $V_{WL1}$ and the case where the potential of word line WL is $V_{WL2}$, the disadvantage of a small write current used in the second write operation can be overcome.

(Conclusion)

As described above, according to the embodiments, first and second currents can be optimized in a nonvolatile semiconductor memory which executes write operations by first and second currents flowing in different directions without deteriorating the resistance-change element and increasing a write error rate.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory comprising:
   a plurality of resistance-change elements having first terminals and second terminals;
   a plurality of transistors having third terminals, fourth terminals and control terminals, the third terminals being connected to the second terminals respectively;
   a first driver electrically connected to the control terminals, applying a first potential to the control terminal of one of the transistors in a first write operation, and applying a second potential larger than the first potential to the control terminal of another one of the transistors in a second write operation; and
   a second driver electrically connected to the first and fourth terminals, applying a third potential larger than a potential of the fourth terminal of the one of the transistors to the first terminal of one of the resistance-change elements in the first write operation, and applying a fourth potential larger than a potential of the first terminal of another one of the resistance-change elements to the fourth terminal of the another one of the transistors in the second write operation,
   wherein the one of the resistance-change elements has first resistance by the first write operation, and the another one of the resistance-change elements has second resistance smaller than the first resistance by the second write operation,
   each of the resistance-change elements is a magnetresistive element,
   the magnetresistive element includes a first magnetic layer with invariable magnetization and a second magnetic layer with variable magnetization,
   the magnetresistive element has the first resistance when a direction of magnetization of the second magnetic layer is substantially opposite to a direction of magnetization of the first magnetic layer, and
   the magnetresistive element has the second resistance when the direction of magnetization of the second magnetic layer is substantially same as the direction of magnetization of the first magnetic layer.

2. The memory of claim 1, wherein the second write operation is executed after the first write operation.

3. The memory of claim 1, wherein the first write operation is executed after the second write operation.

4. The memory of claim 1, wherein the first and second write operations are executed in series.

5. The memory of claim 1, wherein the first and second write operations are executed with a standby time between.

6. The memory of claim 1, wherein the first driver applies the second potential to the control terminal of the another one of the transistors after applying the first potential to the control terminal of the another one of the transistors, and the first potential and the second potential are applied to the control terminal of the another one of the transistors in the second write operation.

* * * * *